(12) United States Patent
Zhang et al.

(10) Patent No.: US 12,182,983 B2
(45) Date of Patent: Dec. 31, 2024

(54) UTILIZE MACHINE LEARNING IN SELECTING HIGH QUALITY AVERAGED SEM IMAGES FROM RAW IMAGES AUTOMATICALLY

(71) Applicant: ASML NETHERLANDS B.V., Veldhoven (NL)

(72) Inventors: Chen Zhang, San Jose, CA (US); Qiang Zhang, Campbell, CA (US); Jen-Shiang Wang, Sunnyvale, CA (US); Jiao Liang, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 698 days.

(21) Appl. No.: 17/268,128

(22) PCT Filed: Jul. 26, 2019

(86) PCT No.: PCT/EP2019/070142
§ 371 (c)(1),
(2) Date: Feb. 12, 2021

(87) PCT Pub. No.: WO2020/035285
PCT Pub. Date: Feb. 20, 2020

(65) Prior Publication Data
US 2022/0351359 A1 Nov. 3, 2022

Related U.S. Application Data

(60) Provisional application No. 62/764,664, filed on Aug. 15, 2018.

(51) Int. Cl.
*G06T 7/00* (2017.01)
*G01N 23/2251* (2018.01)
*G03F 7/00* (2006.01)

(52) U.S. Cl.
CPC ....... *G06T 7/0004* (2013.01); *G01N 23/2251* (2013.01); *G03F 7/705* (2013.01);
(Continued)

(58) Field of Classification Search
CPC ......... G06T 7/0004; G06T 2207/10061; G06T 2207/20081; G06T 2207/20084;
(Continued)

(56) References Cited

U.S. PATENT DOCUMENTS

| 5,229,872 A | 7/1993 | Mumola |
| 6,046,792 A | 4/2000 | Van Der Werf et al. |

(Continued)

FOREIGN PATENT DOCUMENTS

| JP | 2014207110 | 10/2014 |
| TW | 201732450 | 9/2017 |

(Continued)

OTHER PUBLICATIONS

Taiwanese Office Action issued in corresponding Taiwanese Patent Application No. 109129049, dated Jul. 6, 2021.
(Continued)

*Primary Examiner* — Bobbak Safaipour
(74) *Attorney, Agent, or Firm* — Pillsbury Winthrop Shaw Pittman LLP

(57) ABSTRACT

A method for evaluating images of a printed pattern. The method includes obtaining a first averaged image of the printed pattern, where the first averaged image is generated by averaging raw images of the printed pattern. The method also includes identifying one or more features of the first averaged image. The method further includes evaluating the first averaged image, using an image quality classification model and based at least on the one or more features. The
(Continued)

evaluating includes determining, by the image quality classification model, whether the first averaged image satisfies a metric.

20 Claims, 24 Drawing Sheets

(52) U.S. Cl.
CPC ..... *G03F 7/7065* (2013.01); *G01N 2223/401* (2013.01); *G01N 2223/418* (2013.01); *G01N 2223/6116* (2013.01); *G01N 2223/646* (2013.01); *G06T 2207/10061* (2013.01); *G06T 2207/20081* (2013.01); *G06T 2207/20084* (2013.01); *G06T 2207/20216* (2013.01); *G06T 2207/20224* (2013.01); *G06T 2207/30144* (2013.01); *G06T 2207/30148* (2013.01); *G06T 2207/30168* (2013.01)

(58) Field of Classification Search
CPC . G06T 2207/20216; G06T 2207/20224; G06T 2207/30144; G06T 2207/30148; G06T 2207/30168; G06T 7/001; G01N 23/2251; G01N 2223/401; G01N 2223/418; G01N 2223/6116; G01N 2223/646; G01N 21/95607; G01N 21/9501; G01N 21/9515; G01N 2201/12; G03F 7/705; G03F 7/7065; G03F 7/70616; G01B 11/24; G01B 2210/56; G06N 3/02
See application file for complete search history.

(56) References Cited

U.S. PATENT DOCUMENTS

| | | | |
|---|---|---|---|
| 7,587,704 | B2 | 9/2009 | Ye et al. |
| 7,882,480 | B2 | 2/2011 | Ye et al. |
| 9,305,343 | B2 | 4/2016 | Nakahira et al. |
| 2005/0117796 | A1 | 6/2005 | Matsui et al. |
| 2007/0031745 | A1 | 2/2007 | Ye et al. |
| 2007/0050749 | A1 | 3/2007 | Ye et al. |
| 2008/0279445 | A1 | 11/2008 | Matsui et al. |
| 2008/0301620 | A1 | 12/2008 | Ye et al. |
| 2008/0309897 | A1 | 12/2008 | Wong et al. |
| 2009/0157630 | A1 | 6/2009 | Yuan |
| 2010/0162197 | A1 | 6/2010 | Ye et al. |
| 2010/0180251 | A1 | 7/2010 | Ye et al. |
| 2013/0177232 | A1 | 7/2013 | Hirano |
| 2018/0364589 | A1 | 12/2018 | Chen et al. |
| 2021/0174491 | A1* | 6/2021 | Pisarenco ................. G03F 1/86 |
| 2021/0208507 | A1* | 7/2021 | Wang ................... G03F 7/70655 |
| 2022/0137514 | A1* | 5/2022 | Wang ................... G03F 7/70625 355/53 |
| 2022/0404712 | A1* | 12/2022 | Zhang ................. G03F 7/70625 |

FOREIGN PATENT DOCUMENTS

| | | |
|---|---|---|
| WO | 2017060192 | 4/2017 |
| WO | 2019233711 | 12/2019 |

OTHER PUBLICATIONS

International Search Report and Written Opinion issued in corresponding PCT Patent Application No. PCT/EP2019/070142, dated Nov. 15, 2019.
M. Schellenberg et al.: "Adoption of OPC and the impact on design and layout," *Proceedings of the 38th Design Automation Conference*, Las Vegas, NV, USA, pp. 89-92 (2001).
B. Fay, "Advanced optical lithography development, from UV to EUV," Microelectronic Engineering 61-62, 11-24 (2002).
F. Weisbuch et al.: "Enabling scanning electron microscope contour-based optical proximity correction models", J. Micro/Nanolith, MEMS MOEMS, vol. 14(2) (2015).
J. Vasek et al.: "SEM-Contour Based Mask Modeling", Proc. of SPIE, vol. 6924 (2008).
H. Shindo et al.: "High-precision contouring from SEM image in 32-nm lithography and beyond", Proc. of SPIE, vol. 7275 (2009).
D. Hibino et al: "High accuracy OPC-modeling by using advanced CD-SEM based contours in the next-generation lithography", Proc. of SPIE, vol. 7638, (2010).
D. Hibino et al.: "The assessment of the impact of mask pattern shape variation on the OPC-modeling by using SEM contours from wafer and mask", Proc. of SPIE, vol. 8166 (2011).
C. Utzny: "When things go pear shaped: contour variations of contacts", Proc. of SPIE, vol. 8681 (2013).
M. Janssen et al.: "Contact hole litho correlation with shape analysis", Proc. of SPIE, vol. 5148 (2003).
J. Foucher et al.: "The application of critical shape metrology toward CD-SEM measurement accuracy on sub-60nm features", Proc. of SPIE, vol. 5752 (2005).
R. A. Manap et al.: "Non-distortion-specific no-reference image quality assessment: A survey", Information Sciences, vol. 301, pp. 141-160 (2015).
Taiwanese Office Action issued in corresponding Taiwanese Patent Application No. 108128702, dated Feb. 27, 2020.
Korean Office Action issued in corresponding Korean Patent Application No. 10-2021-7004438, dated Nov. 7, 2022.
Office Action issued in corresponding Chinese Patent Application No. 201980053456.5, dated Feb. 1, 2024.

\* cited by examiner

UTILIZE MACHINE LEARNING IN SELECTING HIGH QUALITY AVERAGED SEM IMAGES FROM RAW IMAGES AUTOMATICALLY

CROSS-REFERENCE TO RELATED APPLICATIONS

This application is the U.S. national phase entry of PCT Patent Application No. PCT/EP2019/070142, which was filed on Jul. 26, 2019, which claims the benefit of priority of U.S. Patent Application No. 62/764,664, which was filed on Aug. 15, 2018, and which is incorporated herein in its entirety by reference.

TECHNICAL FIELD

The description herein relates generally to metrology as used with process models for lithographic processes, and more particularly, apparatuses, methods, and computer program products for using machine learning algorithms for automatic selection of images acquired for performing high-quality metrology.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involve processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula $CD=k_1 \times \lambda / NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

The term "projection optics," as used herein, should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

A method for improving a process model for a patterning process includes obtaining a) a measured contour from an image capture device, and b) a simulated contour generated from a simulation of the process model. The method also includes aligning the measured contour with the simulated contour by determining an offset between the measured contour and the simulated contour. The process model is calibrated to reduce a difference, computed based on the determined offset, between the simulated contour and the measured contour.

In some variations, the offset can be further determined based on measurement coordinates substantially defining a portion of the measured contour. Also, the offset can be further determined based on distances between the measurement coordinates and the simulated contour, the distances being in directions perpendicular to the measured contour at the measurement coordinates. The aligning can further include reducing a cost function calculated based on the distances.

In other variations, an edge placement (EP) coordinate can be generated on the measured contour, where the offset can be further determined based on the EP coordinate. The EP coordinate can be generated by interpolating between two or more measurement coordinates. The EP coordinate can be generated by extrapolating from two or more measurement coordinates. Accordingly, the calibrating can further include modifying a feature of the process model to reduce the difference, the modifying causing a change to a shape of the simulated contour.

In some variations, the measured contour can be identified based on a change in intensity of pixels in the measured image. The identifying can be based on the change exceeding a greyscale threshold.

In yet other variations, the model can include obtaining the simulated contour from Graphic Database Systems (GDS) polygons and also converting edge placement coordinates or measurement coordinates comprising the measured contour into GDS coordinates. The GDS polygons can be in one or more formats selected from GDS stream format (GDSII) and Open Artwork System Interchange Standard (OASIS).

In an interrelated aspect, a method for improving an optical proximity correction (OPC) model for a patterning process includes obtaining a) a measured contour from an image capture device, and b) a simulated contour generated from a simulation of the OPC model. The method also includes aligning the measured contour with the simulated contour by determining an offset between the measured contour and the simulated contour. Additionally, the method also includes modifying features of the OPC model to reduce a difference, computed based on the determined offset, between the simulated contour and the measured contour.

In some variations, the features include one or more of a diffusion rate, a diffusion range, a deprotection ratio, and an acid/base concentration. The method can also include obtaining the simulated contour based on the simulation of the OPC model, wherein the OPC model is a preliminary model that includes an optical model and does not include a resist model.

In other variations, the method can include obtaining an initial simulated contour with a preliminary model that includes an optical model and a resist model and modifying features of the resist model to reduce the difference between the initial simulated contour and the measured contour.

In an interrelated aspect, a method for improving a process model for a patterning process includes obtaining a) a measured images from an image capture device, and b) a simulated contour generated from a simulation of the process model. The method also includes, aligning the measured images, generating a combined measured image from the aligned plurality of measured images, extracting a measured contour from the combined measured image by an image analysis method, aligning the measured contour with the simulated contour by determining an offset between the measured contour and the simulated contour, and calibrating the process model to reduce a difference, computed based on the determined offset, between the simulated contour and the measured contour.

In some variations, the combined image can be generated by averaging the aligned measured images. The measured images can be obtained from printed patterns from at least two different dies manufactured from a target pattern. Each of the measured images generating the combined image can be acquired by scanning a different die.

In other variations, the image capture device can be a scanning electron microscope. Obtaining the measured images can be performed by scanning an electron beam over a printed pattern at a number of angles, including approximately +45 degrees and −45 degrees. Also, half of the measured images can be scanned at approximately +45 degrees and another half of the measured images can be scanned at approximately −45 degrees.

In other variations, the obtaining can be performed with the scanning electron microscope operating at a dosage below that required to obtain a scan sufficient to resolve a critical dimension. The image capture device can be an electron beam inspection system. The electron beam inspection system can have a large field of view and the measured images can be obtained at least partially from within the large field of view. The large field of view can be approximately 1-50 microns on a side or approximately 6-12 microns on a side. The electron beam inspection system can detect hotspots or weak-points in a printed pattern.

In yet other variations, the method can further include determining a common area in the plurality of measured images captured from the image capture device and generating the combined measured image based on the common area.

In an interrelated aspect, a method for evaluating images of a printed pattern is implemented by at least one programmable processor. The method includes obtaining a first averaged image of the printed pattern, where the first averaged image is generated by averaging raw images of the printed pattern. The method also includes identifying one or more features of the first averaged image. The method further includes evaluating the first averaged image, by the programmable processor executing an image quality classification model and based at least on the one or more features. The evaluating includes determining, by the image quality classification model, whether the first averaged image satisfies a metric.

In some variations, the first averaged image can be generated by at least aligning the raw images and generating the first averaged image from the aligned raw images.

In other variations, the method can also include generating a label for at least one of the raw images that indicates whether the first averaged image satisfies the metric. Also, the label can be associated in computer memory with the raw images.

In yet other variations, the method can include generating a second averaged image, the generating including a second group of raw images of the printed pattern that were labelled as satisfying the metric, where the second averaged image satisfies the metric.

In some variations, the method can further include training the image quality classification model with a dataset that identifies at least one example of the first averaged image that does not satisfy the metric. The method can also include generating a residual image corresponding to one of the raw images by at least subtracting one of the first plurality of raw images from the first averaged image. The determining can be further based on the first averaged image and the residual image.

In other variations, one or more features of the first averaged image evaluated by the image quality classification model can include at least one of an edge, an assist feature, and a sub-resolution assist feature. The metric can be based on at least one or more of a signal-to-noise ratio, a contrast, and an alignment quality, and the metric can correspond to the raw images that were averaged to generate the averaged image.

In yet other variations, the image quality classification model can further include a machine learning algorithm, where the determining can be based on an output of the machine learning algorithm. The label can be based on the output of the machine learning algorithm and can be at least one of a score or a Boolean value that indicates whether the first averaged image satisfies the metric.

In some variations, the machine learning algorithm can include at least one of a neural network algorithm, a nearest neighbor algorithm, a naive Bayes algorithm, a decision tree algorithm, a linear regression algorithm, a support vector machine algorithm, a k-means clustering, and an association rule algorithm.

In other variations, the raw images can be acquired with an image capture device that can be at least one of a scanning electron microscope, an atomic force microscope, and an electron beam inspection system. The method can include providing active feedback during operation of the image capture device to improve at least one of a focus of the image capture device and a contrast of raw images acquired by the image capture device.

According to an embodiment, there is provided a computer program product comprising a non-transitory computer readable medium having instructions recorded thereon. The instructions, when executed by a computer, implement the methods listed in the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed embodiments. In the drawings.

DETAILED DESCRIPTION

Figure 1:
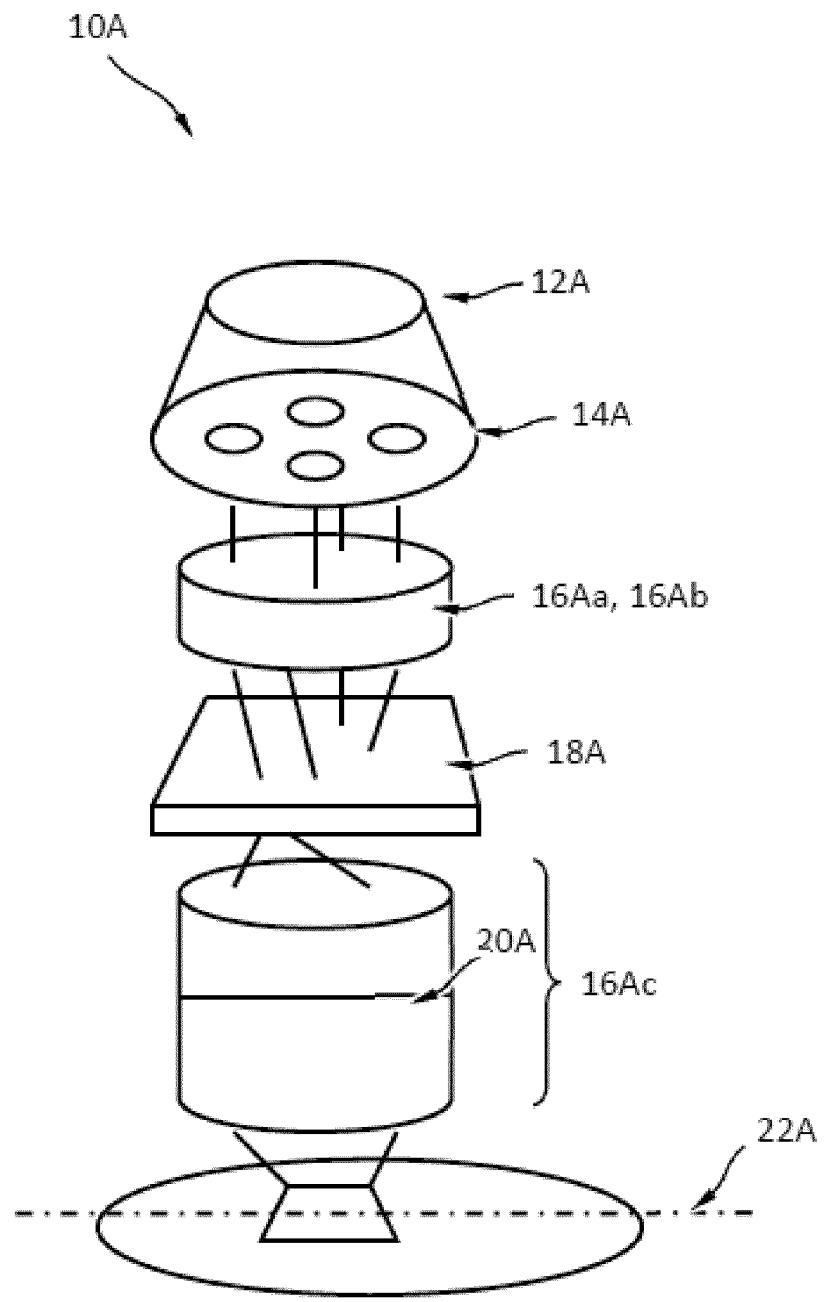
FIG. 1 illustrates a block diagram of various subsystems of a lithographic projection apparatus, according to an embodiment.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

An example of a programmable LCD array is given in U.S. Pat. No. 5,229,872, which is incorporated herein by reference.

FIG. 1 illustrates a block diagram of various subsystems of a lithographic projection apparatus 10A, according to an embodiment. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin($\Theta$ max), wherein n is the refractive index of the media between the substrate and the last element of the projection optics, and $\Theta$ max is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, where each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

According to an embodiment of the present disclosure, one or more images may be generated. The images includes various types of signal that may be characterized by pixel values or intensity values of each pixel. Depending on the relative values of the pixel within the image, the signal may be referred as, for example, a weak signal or a strong signal, as may be understood by a person of ordinary skill in the art. The term "strong" and "weak" are relative terms based on intensity values of pixels within an image and specific values of intensity may not limit scope of the present disclosure. In an embodiment, the strong and weak signal may be identified based on a selected threshold value. In an embodiment, the threshold value may be fixed (e.g., a midpoint of a highest intensity and a lowest intensity of pixel within the image. In an embodiment, a strong signal may refer to a signal with values greater than or equal to an average signal value across the image and a weak signal may refer to signal with values less than the average signal value. In an embodiment, the relative intensity value may be based on percentage. For example, the weak signal may be signal having intensity less than 50% of the highest intensity of the pixel (e.g., pixels corresponding to target pattern may be considered pixels with highest intensity) within the image. Furthermore, each pixel within an image may considered as a variable. According to the present embodiment, derivatives or partial derivative may be determined with respect to each pixel within the image and the values of each pixel may be determined or modified according to a cost function based evaluation and/or gradient based computation of the cost function. For example, a CTM image may include pixels, where each pixel is a variable that can take any real value.

Figure 2:
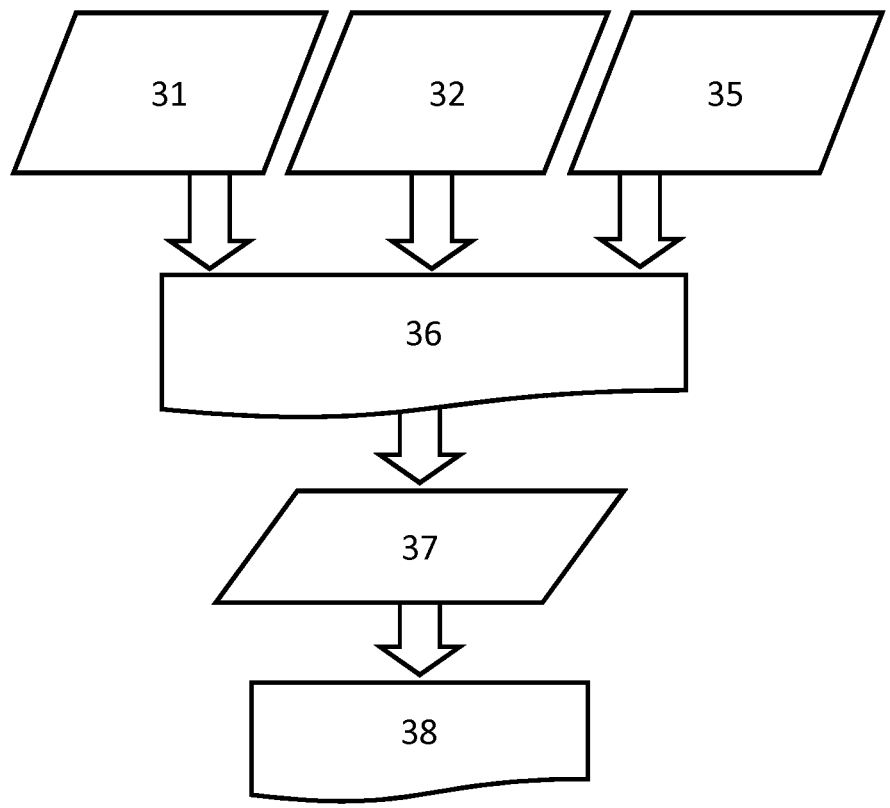
FIG. 2 illustrates an exemplary flow chart for simulating lithography in a lithographic projection apparatus, according to an embodiment.

FIG. 2 illustrates an exemplary flow chart for simulating lithography in a lithographic projection apparatus, according to an embodiment. Source model 31 represents optical characteristics (including radiation intensity distribution and/or phase distribution) of the source. Projection optics model 32 represents optical characteristics (including changes to the radiation intensity distribution and/or the phase distribution caused by the projection optics) of the projection optics. Design layout model 35 represents optical characteristics of a design layout (including changes to the radiation intensity distribution and/or the phase distribution caused by design layout 33), which is the representation of an arrangement of features on or formed by a patterning device. Aerial image 36 can be simulated from design layout model 35, projection optics model 32, and design layout model 35. Resist image 38 can be simulated from aerial image 36 using resist model 37. Simulation of lithography can, for example, predict contours and CDs in the resist image.

More specifically, it is noted that source model 31 can represent the optical characteristics of the source that include, but not limited to, numerical aperture settings, illumination sigma ($\sigma$) settings as well as any particular illumination shape (e.g. off-axis radiation sources such as annular, quadrupole, dipole, etc.). Projection optics model 32 can represent the optical characteristics of the projection optics, including aberration, distortion, one or more refractive indexes, one or more physical sizes, one or more physical dimensions, etc. Design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/ or CD, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another embodiment, an initial larger set of clips may be extracted from the entire design layout by using some kind of automated (such as machine vision) or manual algorithm that identifies the one or more critical feature areas.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N) \quad \text{(Eq. 1)}$$

where ($z_1$, $z_2$, . . . , $z_N$) are N design variables or values thereof. $f_p$ ($z_1$, $z_2$, . . . , $z_N$) can be a function of the design variables ($z_1$, $z_2$, . . . , $z_N$) such as a difference between an actual value and an intended value of a characteristic for a set of values of the design variables of ($z_1$, $z_2$, . . . , $z_N$). $w_p$ is a weight constant associated with $f_p$ ($z_1$, $z_2$, . . . , $z_N$). For example, the characteristic may be a position of an edge of a pattern, measured at a given point on the edge. Different $f_p$ ($z_1$, $z_2$, . . . , $z_N$) may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. $f_p$ ($z_1$, $z_2$, . . . , $z_N$) can also be a function of an interlayer characteristic, which is in turn a function of the design variables ($z_1$, $z_2$, . . . , $z_N$). Of course, CF ($z_1$, $z_2$, . . . , $z_N$) is not limited to the form in Eq. 1. CF ($z_1$, $z_2$, . . . , $z_N$) can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, an interlayer characteristic, or a combination thereof. In one embodiment, the design variables ($z_1$, $z_2$, . . . , $z_N$) comprise one or more selected from dose, global bias of the patterning device, and/or shape of illumination. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_v(z_1, z_2, \ldots, z_N)$). The design variables can include any adjustable parameter such as an adjustable parameter of the source, the patterning device, the projection optics, dose, focus, etc.

The lithographic apparatus may include components collectively called a "wavefront manipulator" that can be used to adjust the shape of a wavefront and intensity distribution and/or phase shift of a radiation beam. In an embodiment, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the characteristics represented by the cost function. Such changes can be simulated from a model or actually measured. The design variables can include parameters of the wavefront manipulator.

The design variables may have constraints, which can be expressed as ($z_1$, $z_2$, . . . , $z_N$)∈Z, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

As used herein, the term "patterning process" generally means a process that creates an etched substrate by the application of specified patterns of light as part of a lithography process. However, "patterning process" can also include plasma etching, as many of the features described herein can provide benefits to forming printed patterns using plasma processing.

As used herein, the term "target pattern" means an idealized pattern that is to be etched on a substrate.

As used herein, the term "printed pattern" means the physical pattern on a substrate that was etched based on a target pattern. The printed pattern can include, for example, troughs, channels, depressions, edges, or other two and three dimensional features resulting from a lithography process.

As used herein, the term "process model" means a model that includes one or more models that simulate a patterning process. For example, a process model can include an optical model (e.g., that models a lens system/projection system used to deliver light in a lithography process and may include modelling the final optical image of light that goes onto a photoresist), a resist model (e.g., that models physical effects of the resist, such as chemical effects due to the light), and an OPC model (e.g., that can be used to make target patterns and may include sub-resolution resist features (SRAFs), etc.).

As used herein, the term "calibrating" means to modify (e.g., improve or tune) and/or validate something, such as the process model.

The present disclosure describes, among other things, methods for improving a process model for a patterning process. Improving metrology during process model calibration can include obtaining accurate images of a printed pattern (e.g., a printed wafer or portion thereof) that is based on a target pattern. From the images, contours can be extracted that correspond to features on the printed pattern. The contours (also referred to as measured contours) can then be aligned to simulated contours, generated by the process model, to allow for calibration of the process model. The process model can be improved by adjusting parameters in the process model such that the simulated contours more accurately match the measured contours.

Figure 3:
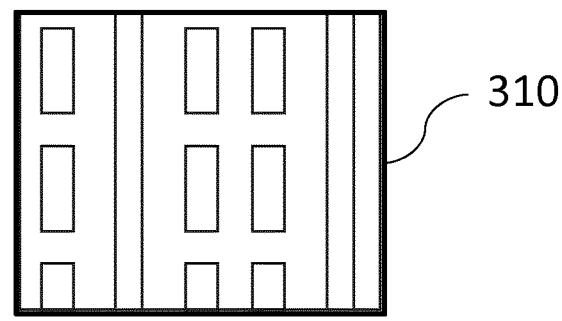
FIG. 3 illustrates an exemplary measured contour obtained from an image of a printed pattern, according to an embodiment.
Figure 3:
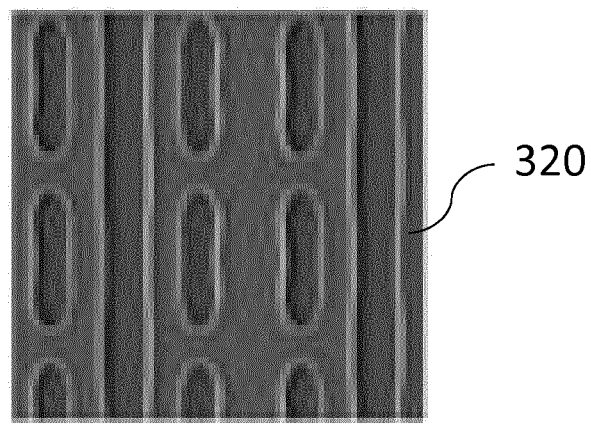
Figure 3:
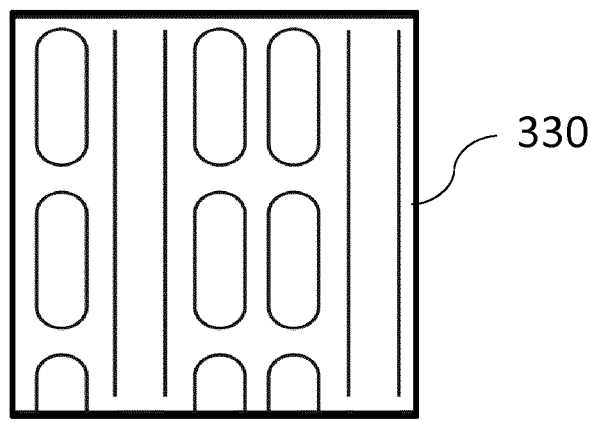

FIG. 3 illustrates an exemplary measured contour 330 obtained from an image of a printed pattern, according to an embodiment.

Lithographic processes can create of printed patterns (e.g., circuit patterns for integrated circuits or computer chips) based on, for example, target pattern 310 (shown in the top panel of FIG. 3). Due to limitations in the patterning process, a printed pattern will generally only be an approximation of the target pattern 310.

A printed pattern can be imaged by an image capture device to generate measured image 320 (shown in the middle panel of FIG. 3), which contains contours that correspond to the idealized shapes in target pattern 310. In one embodiment, a method can include obtaining measured contour 330 from an image capture device, for example, a scanning electron microscope (also referred to as an electron beam inspection system). Exemplary embodiments of an electron beam inspection system are described in further detail with reference to FIGS. 19 and 20. The electron beam inspection system can be similar to scanning electron microscope but have a large field of view (LFOV) and high throughput for obtaining measured image 320. One non-limiting example of an electron beam inspection system can be an HMI eP5, specifically configured to have a LFOV. In some embodiments, a LFOV can measure, on a side, for example, approximately 1-1000 microns, 100-500 microns, 1-50 microns, 6-12 microns, etc. The image capture device can be configured to detect hotspots and/or weak-points in the printed pattern as well as gates and active areas of a memory array, such as a static random access memory (SRAM). As illustrated in FIG. 3, measured image 320 resembles the printed pattern, but the rectangular features in measured image 320 show rounding and slightly distorted lines.

Some embodiments can include identifying measured contour 330 (shown in the bottom panel of FIG. 3) based on a change in intensity of pixels in measured image 320. Image analysis techniques can be used to identify measured contour 330 in measured image 320. Changes in intensity, gradient, and the like, can identify a change in height (or depth) of features in printed pattern, for example as used with edge determination. For example, when the measured image is expressed as a greyscale image, when the change exceeds a greyscale threshold (i.e., an intensity above or below a defined value), this can identify an edge (i.e. measured contour 330).

Figure 4:
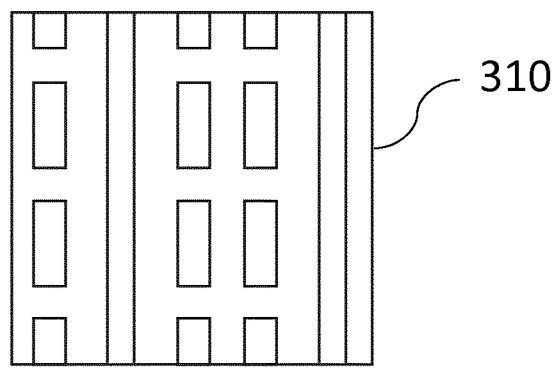
FIG. 4 illustrates an exemplary method of generating a measured contour by averaging multiple images, according to an embodiment.
Figure 4:
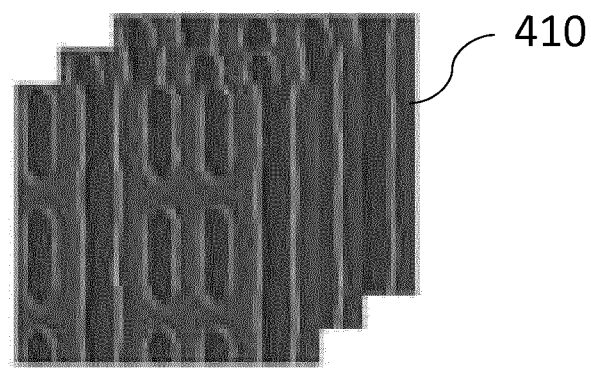
Figure 4:
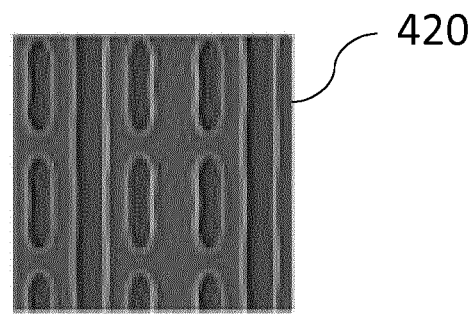
Figure 4:
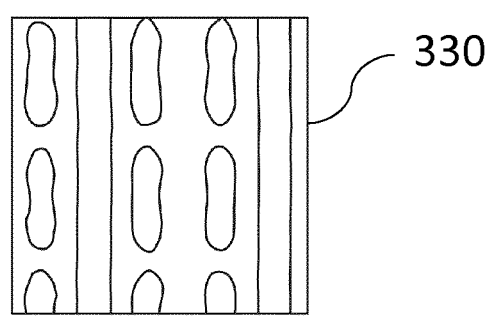

FIG. 4 illustrates an exemplary method of generating measured contour 330 by averaging multiple images, according to an embodiment.

As described above, measured contour 330 can be extracted from a single measured image 320. However, in other embodiments, multiple images of a printed pattern can be combined into a combined image 420. Combining images reduce the effects of noise or other forms of error that can be present in any single image. In one embodiment, combined image 420 can be generated by averaging multiple measured images 410. In other embodiments, multiple measured images 410 can be aligned before combining or averaging. Image alignment can be based on, for example, image registration (such as using registration marks) of multiple measured images 410, an image analysis program determining a best match between multiple measured images 410, calculating a correlation coefficient based on multiple measured images 410, etc.

Once multiple measured images 410 captured from the image capture device are aligned, a common area can be determined. As used herein, the term "common area" means a collection of pixels in the multiple measured images 410 that refer to the same physical area of the printed pattern. Subsequently, combined measured image 320 can be generated based on the common area. This can cause some images, which may have a larger or smaller field of view, to have edge pixels removed such that the averaging procedure is uniform (i.e. the same number of pixels are averaged at each pixel).

Resist shrinkage from repeated electron beam exposure can occur when acquiring multiple images. Resist shrinkage can be reduced, for example, by embodiments where multiple measured images 410 are obtained from printed patterns from at least two different dies manufactured from a target pattern. As used herein, the term "die" or "dies" means a block of semiconducting material on which a given functional circuit is, or will be, fabricated. In such embodiments, the dies have a similar printed pattern, and thus can be used to generate substantially equivalent images while reducing physical exposure of the printed pattern to the electron beam. In other embodiments, each of the multiple measured images 410 generating combined image 420 can be acquired by scanning a different die. In this way, each image used in generating the combined image 420 is based on a single printed pattern. In this way, in some embodiments, resist shrinkage can be reduced by obtaining measured image 320 with the scanning electron microscope operating at a dosage below that required to obtain a scan sufficient to resolve a critical dimension.

In some embodiments, obtaining measured images 320 can be performed by scanning an electron beam over a printed pattern at several angles. The angles can include approximately +45 degrees and −45 degrees. As used herein, the term "approximately" (for example with reference to scanning angles) means the exact angle or an angle very close to the exact angle (e.g., within a few degrees or tenths of degrees). In another embodiment, half of the measured images 320 can be scanned at approximately +45 degrees and another half of the measured images 320 can be scanned at approximately −45 degrees.

Figure 5:
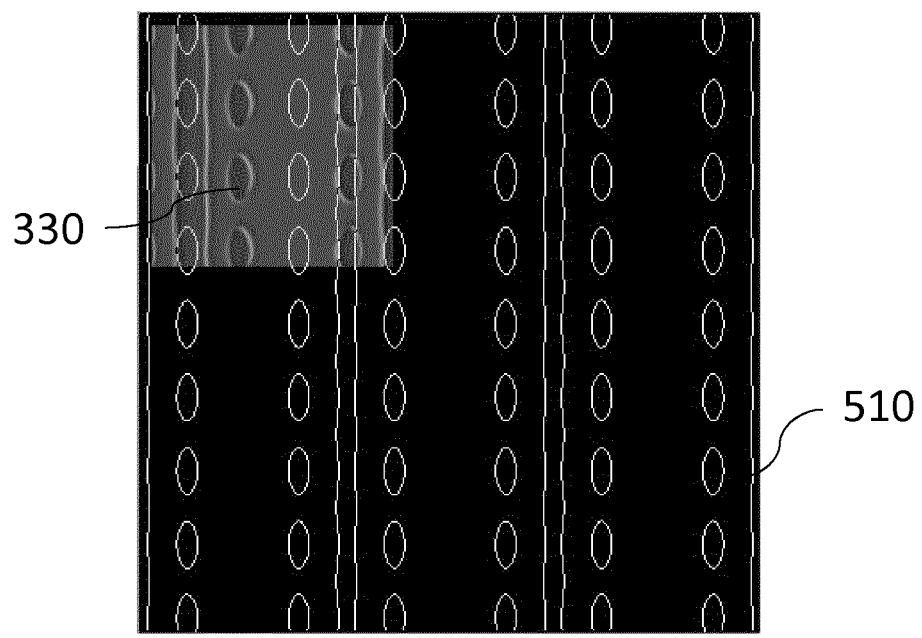
FIG. 5 illustrates an exemplary method of aligning a measured contour with a simulated contour, according to an embodiment.
Figure 5:
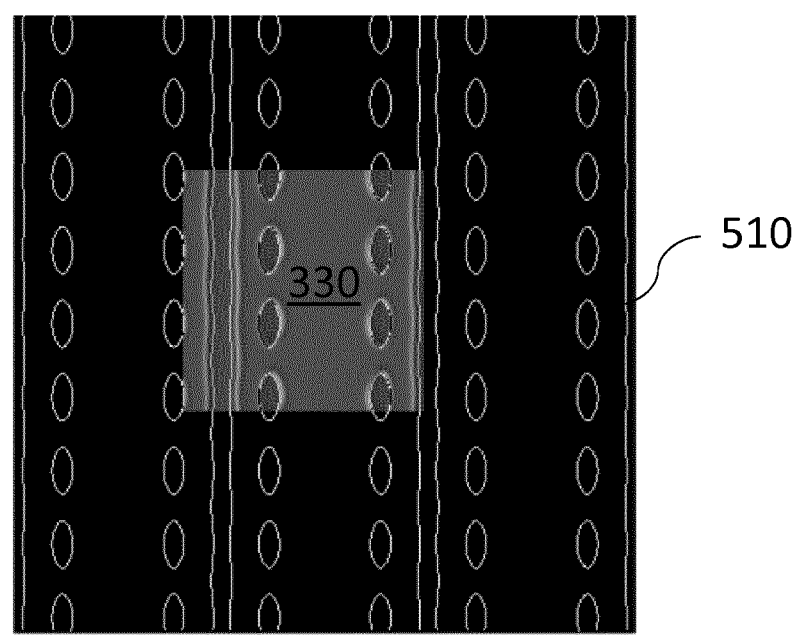

FIG. 5 illustrates an exemplary method of aligning measured contour 330 with simulated contour 510, according to an embodiment.

Process models that simulate a printed pattern can include any combination of resist models, optical models, optical proximity correction models, etc. Accordingly, simulated contour 510 can be generated from a simulation of the process model. As used herein, "simulated contour 510" means a contour that is generated by one or more computational models and represents a predicted outcome (whether a final stage or an intermediate stage) of a lithography process.

To calibrate a process model, measured contours 330 can be compared with simulated contours 510. As part of the calibration process, measured contour 330 can be aligned with simulated contour 510. In the example of FIG. 5, measured contour 330 (as represented in this specific illustration by a graphical representation of measured image 320) can be compared with simulated contour 510. In the upper diagram of FIG. 5, measured contour 330 is not aligned properly with simulated contour 510. Measured contour 330 can be translated and/or rotated over simulated contour 510 until measured contour 330 is in approximately the correct position, as shown in the lower diagram of FIG. 5. This can provide a coarse alignment which can be further improved upon as described below.

Figure 6:
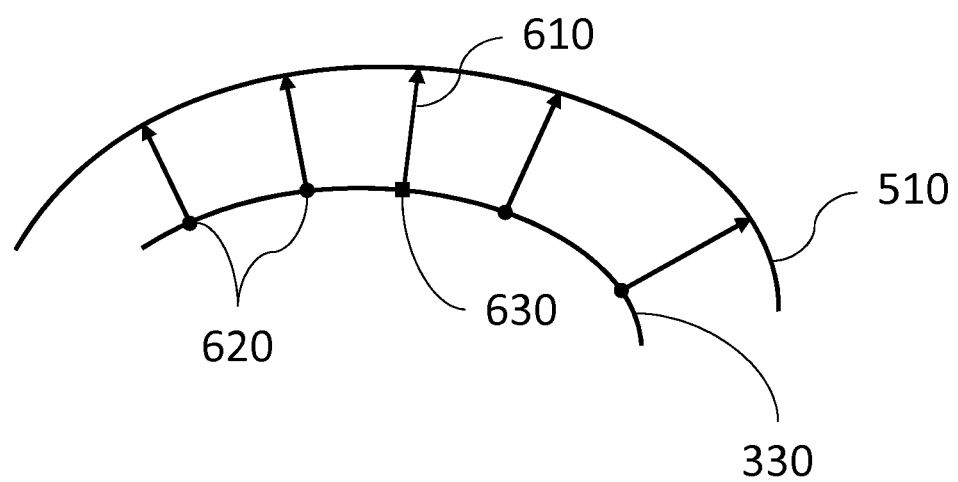
FIG. 6 illustrates an exemplary method of determining an offset between a measured contour and a simulated contour, according to an embodiment.

FIG. 6 illustrates an exemplary method of determining offset 610 between measured contour 330 and simulated contour 510, according to an embodiment.

Other alignment methods can be implemented, for example, after the coarse alignment described above with reference to FIG. 5. Such implementations can include aligning measured contour 330 with simulated contour 510 by determining offset 610 between measured contour 330 and simulated contour 510. As used herein, "offset 610" means a distance between a point on measured contour 330, and another point on simulated contour 510. The present disclosure provides various methods for determining offset 610. For example, offset 610 can be further determined based on measurement coordinates 620 substantially defining a portion of the measured contour 330. As used herein, the term "measurement coordinates" means coordinates that define some or all of a measured contour. Measurement coordinates can be generated by the imaging device, by analysis of images taken by the imaging device, etc. For example, measurement coordinates can be pixel positions that have been determined to correspond to an edge of a contour. Accordingly, an edge detection program can generate measurement coordinates 620 based on image processing of measured image 320. Examples of measurement coordinates 620 are illustrated in FIG. 6 by circles on measured contour 330.

In one embodiment, offset 610 can be further determined based on distances between measurement coordinates 620 and simulated contour 510. In some specific embodiments, the distances can be in directions perpendicular to measured contour 330 at measurement coordinates 620. In other embodiments, the degree of alignment can be determined by for example, summing the squares of distance of some or all offsets, or summing some or all offsets. This can be performed, for example, with the x-component and/or the y-component of the perpendicular offset vector.

In some embodiments, the aligning can further include reducing a cost function calculated based on the distances. Examples of cost functions are described above (e.g., the description of Eqn. 1). A cost function can be reduced by, for example, fine adjustments to the position of measured contour 330. When cost function is at a minimum (or otherwise satisfactory value), the alignment of measured contour 330 to simulated contour 510 can be used for further processes or as a measure of the process model calibration.

To provide additional points for the alignment methods described herein, certain embodiments can include generating any number of additional points (e.g., edge placement (EP) coordinates) on measured contour 330. As used herein, EP coordinate 630 (also referred to herein as an EP gauge), is an additional point that defines measured contour 330. One example of EP coordinate 630 is illustrated in FIG. 6 by the solid square located on measured contour 330. In some embodiments, EP coordinate 630 can be generated by interpolating between two or more measurement coordinates 620. In other embodiments, EP coordinate 630 can be generated by extrapolating from two or more measurement coordinates 620. Accordingly, offset 610 can be further determined based on EP coordinate 630, alternatively or in addition to, measurement coordinates 620.

In some embodiments, simulated contour 510 can be obtained from Graphic Database Systems (GDS) polygons, i.e., polygons generated by the process model and corresponding to a contour shape. In other embodiments, the GDS polygons can be in one or more formats selected from GDS stream format (GDSII) and Open Artwork System Interchange Standard (OASIS). Then, as part of the calibration process, edge placement coordinates 630 and/or measurement coordinates 620 comprising measured simulated contour 510 can be converted into GDS coordinates. Such a conversion can allow a more direct comparison between simulated contour 510 and measured contour 330.

Figure 7:
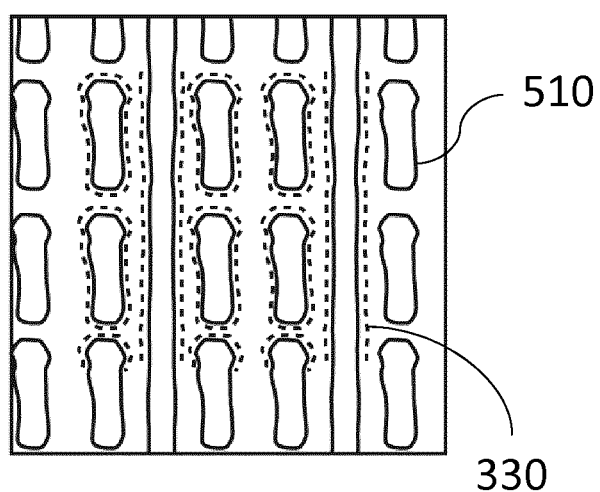
FIG. 7 illustrates an exemplary improvement of matching a simulated contour to a measured contour, according to an embodiment.

FIG. 7 illustrates an exemplary improvement of matching a simulated contour 510 to a measured contour 330, according to an embodiment.

The embodiments described herein can facilitate calibrating a process model to provide a more accurate match between a simulated contour 510 (generated by the process model) and the measured contour 330. In some embodiments, calibrating the process model can include reducing a difference, computed based on a determined offset 610, between simulated contour 510 and measured contour 330.

As used herein, "difference" means a quantified measure of degree of deviation between two or more contours. One non-limiting example of a difference is the aforementioned cost function. Another example of a difference can also be the offset or distance between points on two contours, without using them in a cost function.

In some embodiments, methods can include modifying a feature of the process model to reduce the difference. In some embodiments, the modifying can cause a change to a shape of simulated contour 510. Examples of features of the resist model that can be modified can include diffusion rate, diffusion range, deprotection ratio, and acid/base concentration. Modifications performed in this way can be considered a "fine-tuning" of the process model to improve its ability to predict measured contours 330. In some embodiments, this can result in an improved optical model, resist model, OPC model, etc.

Figure 8:
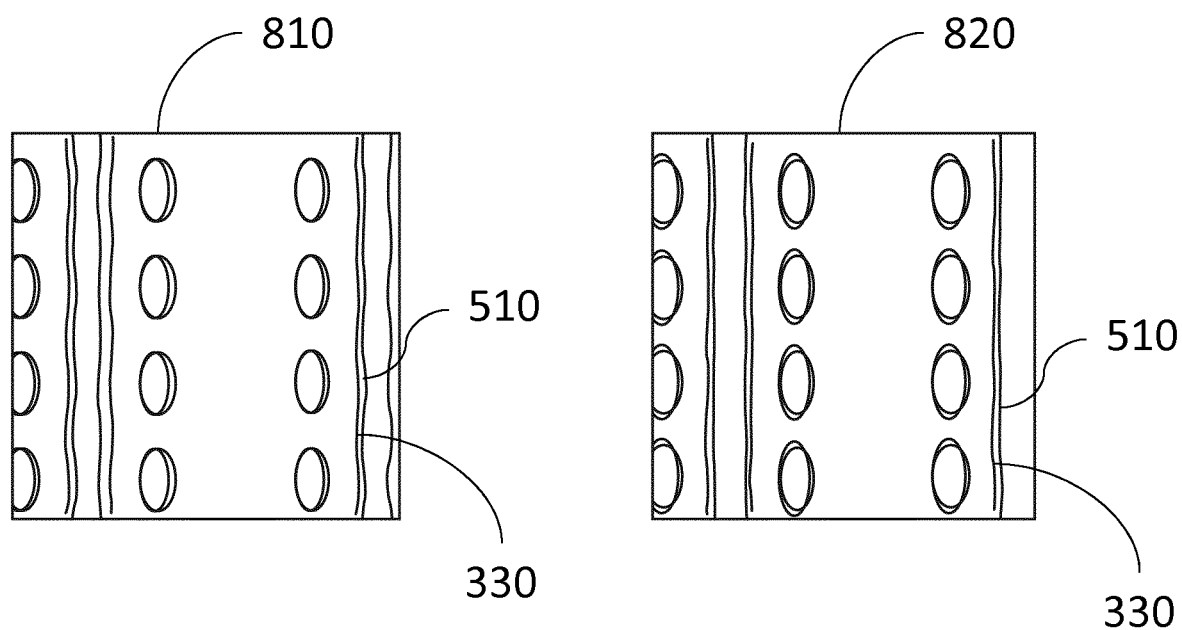
FIG. 8 illustrates an exemplary improvement in alignment based on improving a preliminary model, according to an embodiment.

FIG. 8 illustrates an exemplary improvement in alignment based on improving a preliminary model 810, according to an embodiment.

Improving a process model, including an OPC model, can begin with a preliminary model 810 instead of, for example, a full process model. For example, some embodiments can include obtaining the simulated contour 510 based on the simulation of the OPC model, where the OPC model can be preliminary model 810. Preliminary model 810 can include a reduced number of model components, for example, including an optical model and not including a resist model.

In other embodiments, methods can include obtaining initial simulated contour 510 with improved preliminary model 820 (e.g., that includes an optical model and a resist model). Specifically, some embodiments can include modifying features of the resist model to reduce the difference between the initial simulated contour 510 and the measured contour 330. Examples of features that can be modified can include diffusion rate, diffusion range, deprotection ratio, and acid/base concentration, as described above with reference to a resist model. In this way, the preliminary model 810 can be used and improved as described herein. In other embodiments, modification to the preliminary model 810 can generate improved preliminary model 820 in turn generate simulated contours 510. Such iterative methods can provide increasingly improved simulated contours 510 for the alignment procedures described herein.

In some embodiments of the present disclosure, reduced processing time and computational overhead have been realized. For example, by leveraging features including image-averaging (such as described with reference to FIG. 4) and accurate image alignment (such as described with reference to FIG. 3), computational time for image acquisition has been reduced at least an order of magnitude, from days to hours. At the same time, the model calibration time implementing these high quality EP gauges is about the same as when using CD gauges.

Figure 9:
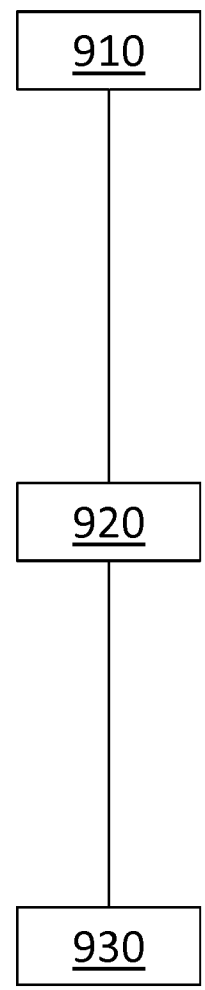
FIG. 9 illustrates an exemplary method of calibrating a process model, according to an embodiment.

FIG. 9 illustrates an exemplary method of calibrating a process model, according to an embodiment.

In some embodiments, a method for improving a process model for a patterning process can include, at 910, obtaining a) measured contour 330 from an image capture device, b) simulated contour 510 generated from a simulation of the process model.

At 920, aligning measured contour 330 with simulated contour 510 by determining offset 610 between measured contour 330 and simulated contour 510.

At 930, calibrating the process model to reduce a difference, computed based on determined offset 610, between simulated contour 510 and measured contour 330.

Figure 10:
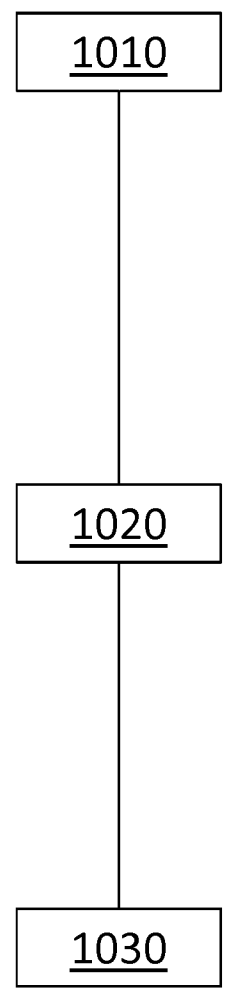
FIG. 10 illustrates an exemplary method of calibrating an OPC model, according to an embodiment.

FIG. 10 illustrates an exemplary method of calibrating an OPC model, according to an embodiment.

In some embodiments, a method for improving an optical proximity correction (OPC) model for a patterning process can include, at 1010, obtaining a) measured contour 330 from image capture device, and b) simulated contour 510 generated from a simulation of the OPC model.

At 1020, aligning measured contour 330 with simulated contour 510 by determining offset 610 between measured contour 330 and simulated contour 510.

At 1030, modifying features of the OPC model to reduce a difference, computed based on determined offset 610, between simulated contour 510 and measured contour 330.

Figure 11:
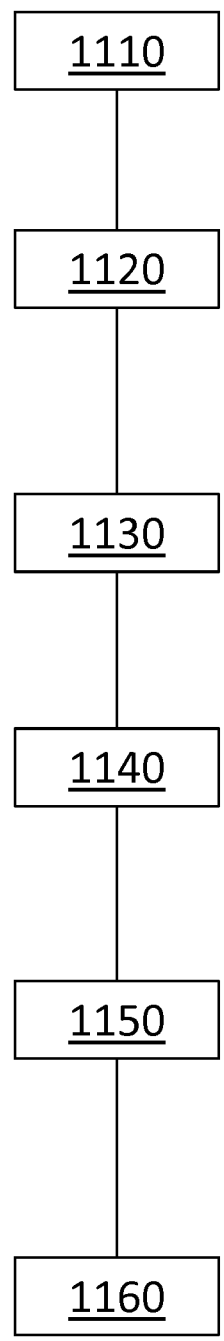
FIG. 11 illustrates an exemplary method of acquiring multiple images of a target and calibrating a process model, according to an embodiment.

FIG. 11 illustrates an exemplary method of acquiring multiple images of a target and calibrating a process model, according to an embodiment.

In some embodiments, a method for improving a process model for a patterning process can include, at 1110, obtaining a) multiple measured images 410 from an image capture device, and b) simulated contour 510 generated from a simulation of the process model.

At 1120, aligning multiple measured images 410.

At 1130, generating a combined measured image 320 from the aligned multiple measured images 410.

At 1140, extracting measured contour 330 from combined measured image 320 by an image analysis method.

At 1150, aligning measured contour 330 with simulated contour 510 by determining offset 610 between measured contour 330 and simulated contour 510.

At 1160, calibrating the process model to reduce a difference, computed based on determined offset 610, between simulated contour 510 and measured contour 330.

Figure 12:
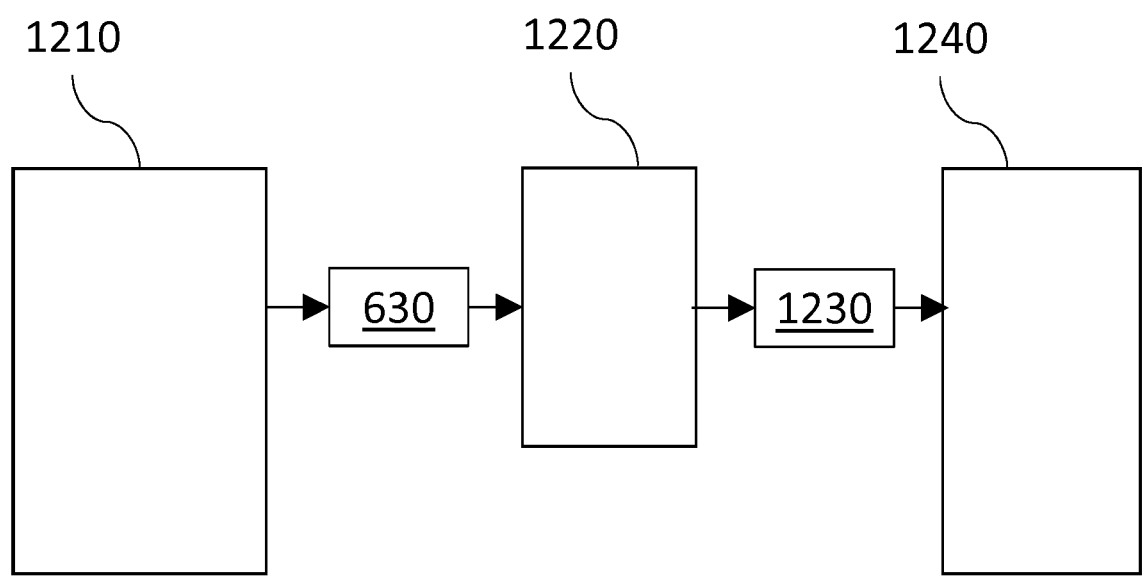
FIG. 12 is a block diagram of an example computer system, according to an embodiment.

FIG. 12 is a block diagram of an example metrology system, according to an embodiment. The embodiments described herein can be implemented on any number and combination of computing systems, image capture devices, servers, and user interfaces. One exemplary system is illustrated in FIG. 12, where cluster 1210, which may optionally contain any number of computers operating in series and/or parallel, can be configured to allow selection and transmission of EP coordinates 630, also referred to herein as EP gauges 630. EP gauges 630 can be transmitted to one or more managing servers 1220, where recipe 1230 can be sent to image capture device 1240. Recipe 1230 can include information about the patterning process and also instructions for operation of image capture device 1240. The exemplary systems thus described improve OPC prediction accuracy and reduce OPC development cycle time.

Figure 13:
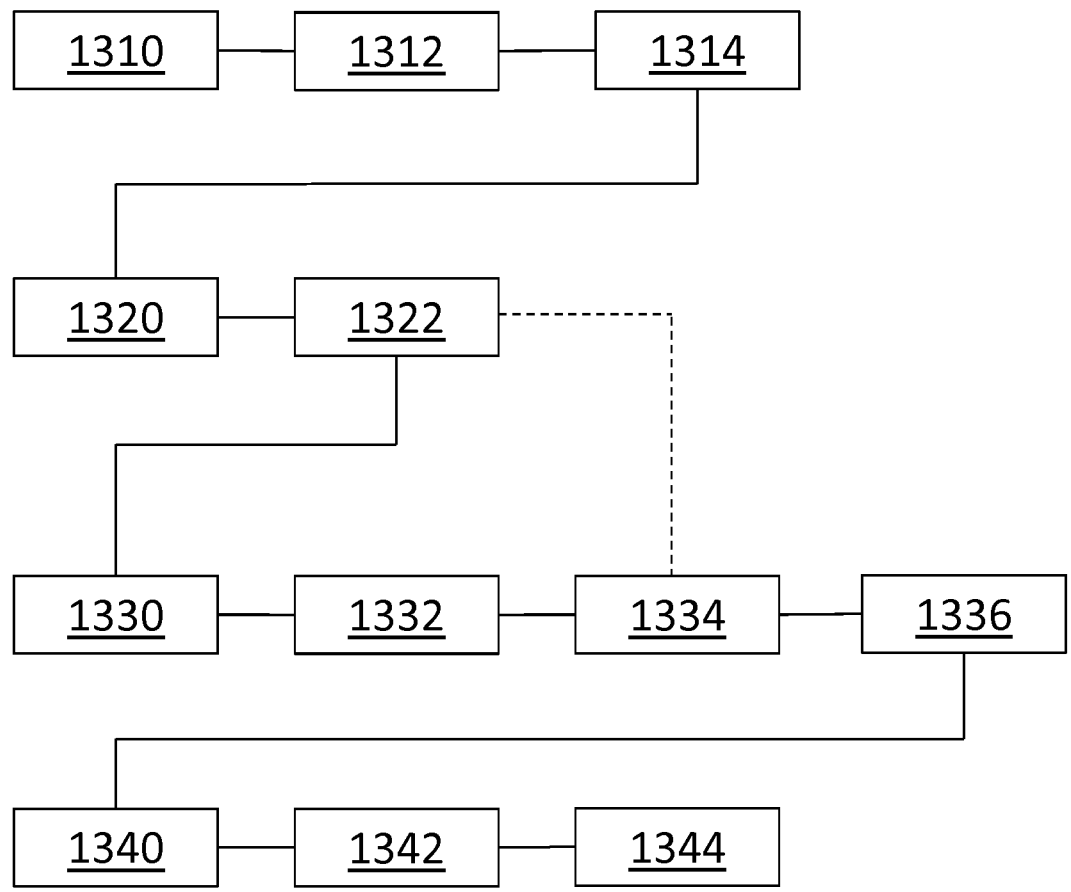
FIG. 13 is a block diagram of an example metrology system, according to an embodiment.

FIG. 13 is a process flow diagram of an example implementation of an improved metrology process, according to an embodiment.

A method for improving metrology according to the systems and embodiments described herein can include executing a process model on a computing cluster, such as cluster 1210. The process model can accept, at 1310, a reticle design. The process model can then generate, at 1312, a GDS layout specifying the target pattern. At 1314, the process model can then select one or more EP gauges, for example as described with reference to FIG. 6.

An image capture device, for example image capture device 1240, can generate, at 1320, recipe 1230. Recipe 1230 can be used by image capture device 1240 to perform, at 1322, high-quality metrology on the printed pattern, including generating any number of high-resolution measured images. Measured images can be transmitted to cluster 1210 for image processing.

Image processing can include, for example, executing image filtering at 1330, image alignment and averaging 1332, contour extraction 1334, and EP gauge extraction 1336. Image filtering can include, for example, automatic removal of misprinted images and/or low contrast images, based for example on permitted benchmarks or tolerances. Optionally, recipe 1230 and measured images 320 can be input from 1322, as part of the contour extraction process to increase metrology consistency by comparing measured images 320 before and after the image filtering and averaging alignment processes.

Model calibration and validation can be performed at 1340, where the EP gauges extracted at 1336 can be received by one or more computing systems. The calibrated and validated model can be optimized, at 1340, to support a large number of EP gauges, for example an increase by a factor of 2, 3, 3.6, 5, 10, or more, over the number of CD gauges. At 1342, the process model can be calibrated and at 1344, the calibrated process model can be provided to a graphical user interface (GUI) for user review, refinement, transmission, or further processing.

Figure 14:
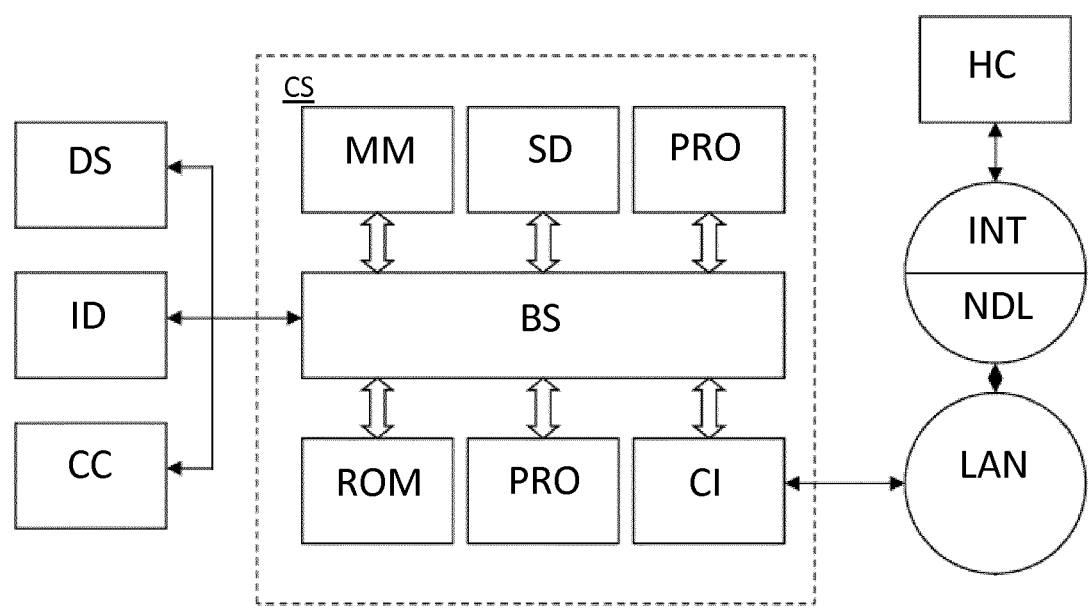
FIG. 14 is a process flow diagram of an example implementation of an improved metrology process, according to an embodiment.

FIG. 14 is a block diagram of an example computer system CS, according to an embodiment.

Computer system CS includes a bus BS or other communication mechanism for communicating information, and a processor PRO (or multiple processor) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 15:
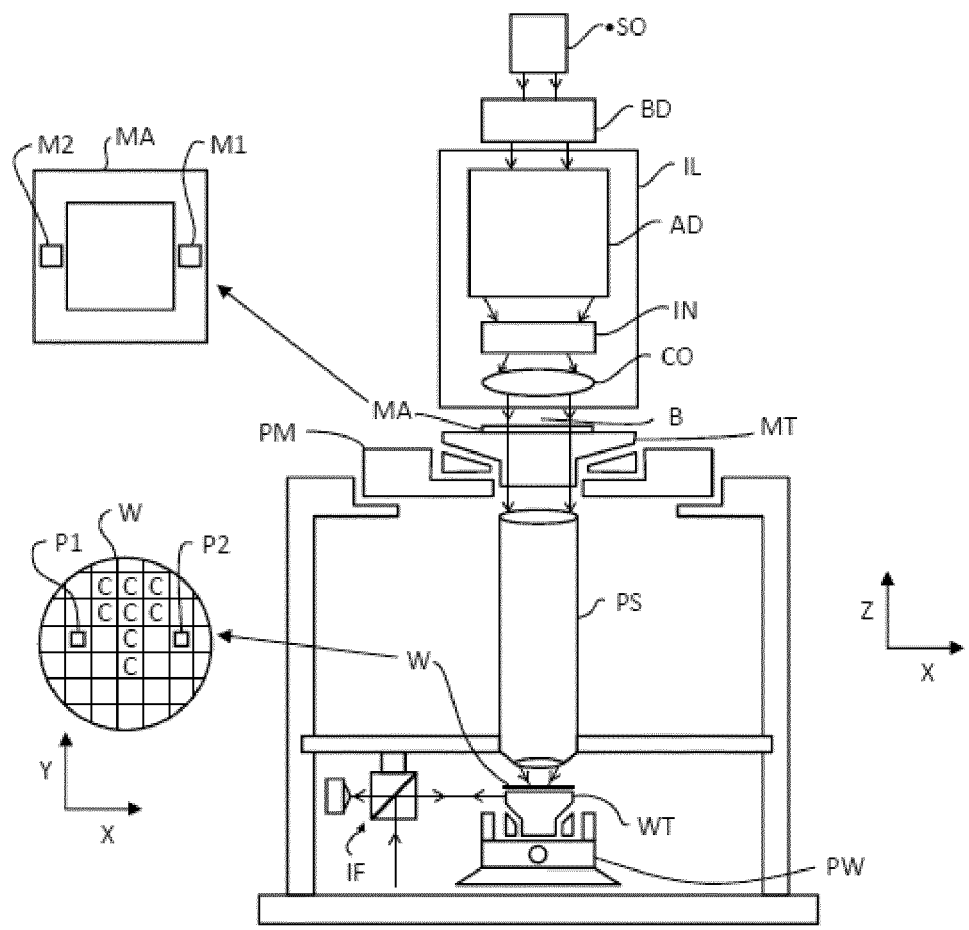
FIG. 15 is a schematic diagram of a lithographic projection apparatus, according to an embodiment.

FIG. 15 is a schematic diagram of a lithographic projection apparatus, according to an embodiment.

The lithographic projection apparatus can include an illumination system IL, a first object table MT, a second object table WT, and a projection system PS.

Illumination system IL, can condition a beam B of radiation. In this particular case, the illumination system also comprises a radiation source SO.

First object table (e.g., patterning device table) MT can be provided with a patterning device holder to hold a patterning device MA (e.g., a reticle), and connected to a first positioner to accurately position the patterning device with respect to item PS.

Second object table (substrate table) WT can be provided with a substrate holder to hold a substrate W (e.g., a resist-coated silicon wafer), and connected to a second positioner to accurately position the substrate with respect to item PS.

Projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and Γ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or F2 lasing).

The beam PB can subsequently intercept patterning device MA, which is held on a patterning device table MT.

Having traversed patterning device MA, the beam B can pass through the lens PL, which focuses beam B onto target portion C of substrate W. With the aid of the second positioning means (and interferometric measuring means IF), the substrate table WT can be moved accurately, e.g. so as to position different target portions C in the path of beam PB. Similarly, the first positioning means can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool) patterning device table MT may just be connected to a short stroke actuator, or may be fixed.

The depicted tool can be used in two different modes, step mode and scan mode. In step mode, patterning device table MT is kept essentially stationary, and an entire patterning device image is projected in one go (i.e., a single "flash") onto a target portion C. Substrate table WT can be shifted in the x and/or y directions so that a different target portion C can be irradiated by beam PB.

In scan mode, essentially the same scenario applies, except that a given target portion C is not exposed in a single "flash." Instead, patterning device table MT is movable in a given direction (the so-called "scan direction", e.g., the y direction) with a speed v, so that projection beam B is caused to scan over a patterning device image; concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 16:
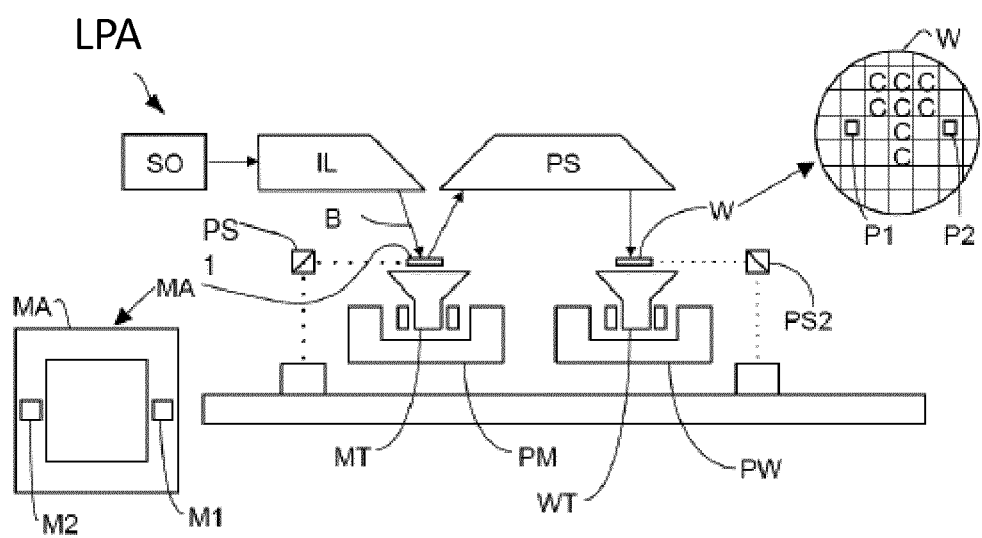
FIG. 16 is a schematic diagram of another lithographic projection apparatus, according to an embodiment.

FIG. 16 is a schematic diagram of another lithographic projection apparatus (LPA), according to an embodiment.

LPA can include source collector module SO, illumination system (illuminator) IL configured to condition a radiation beam B (e.g. EUV radiation), support structure MT, substrate table WT, and projection system PS.

Support structure (e.g. a patterning device table) MT can be constructed to support a patterning device (e.g. a mask or a reticle) MA and connected to a first positioner PM configured to accurately position the patterning device.

Substrate table (e.g. a wafer table) WT can be constructed to hold a substrate (e.g. a resist coated wafer) W and connected to a second positioner PW configured to accurately position the substrate.

Projection system (e.g. a reflective projection system) PS can be configured to project a pattern imparted to the radiation beam B by patterning device MA onto a target portion C (e.g. comprising one or more dies) of the substrate W.

As here depicted, LPA can be of a reflective type (e.g. employing a reflective patterning device). It is to be noted that because most materials are absorptive within the EUV wavelength range, the patterning device may have multi-layer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser, not shown in FIG. 11, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

Illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode.

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de-) magnification and image reversal characteristics of the projection system PS.

In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
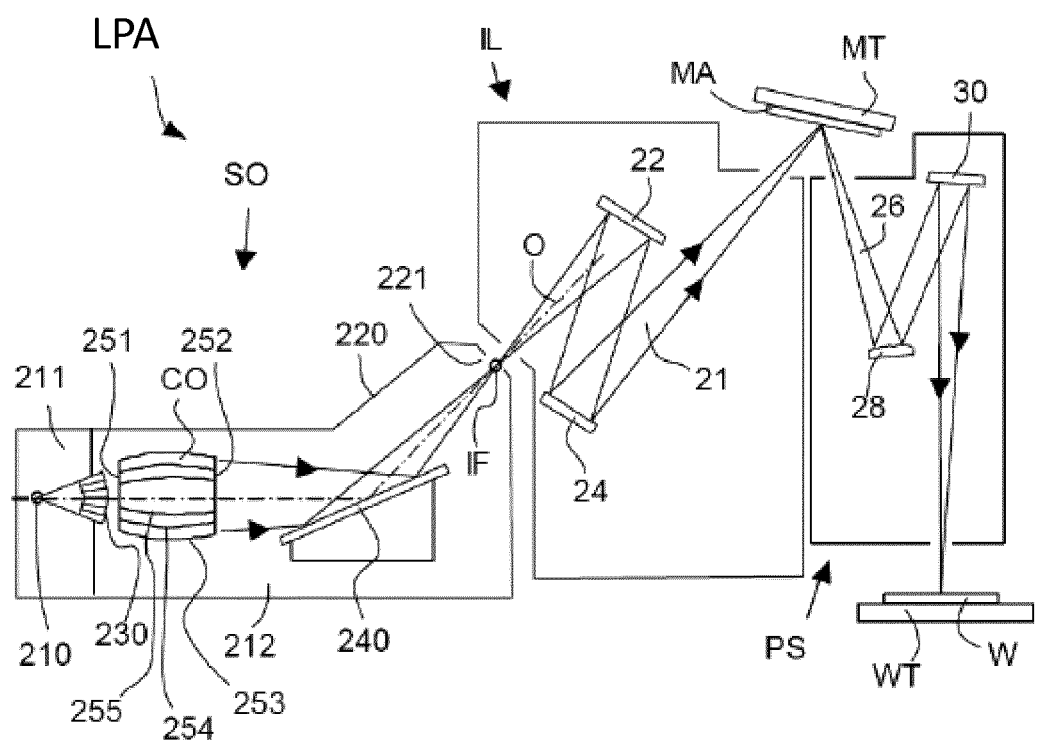
FIG. 17 is a detailed view of the lithographic projection apparatus, according to an embodiment.

FIG. 17 is a detailed view of the lithographic projection apparatus, according to an embodiment.

As shown, LPA can include the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line '0'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 12.

Collector optic CO, as illustrated in FIG. 12, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 18:
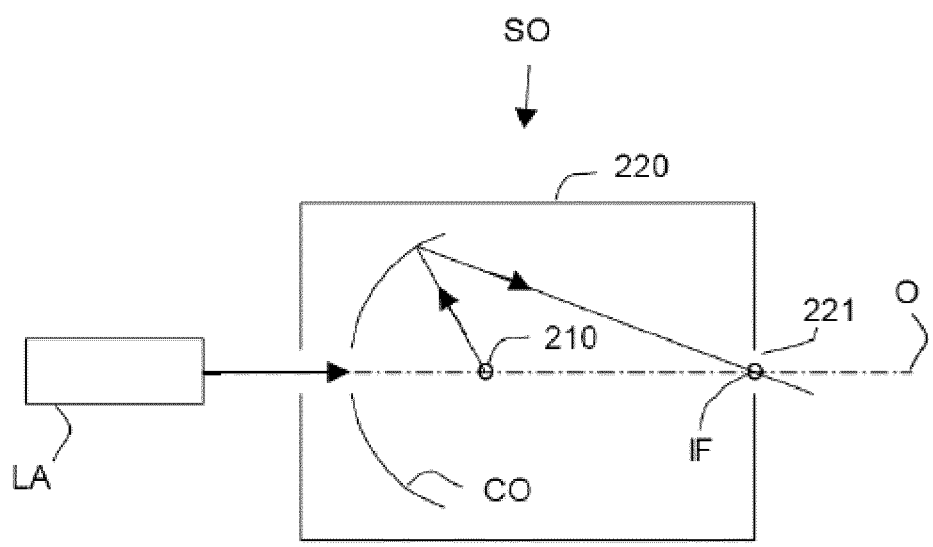
FIG. 18 is a detailed view of the source collector module of the lithographic projection apparatus, according to an embodiment.

FIG. 18 is a detailed view of source collector module SO of lithographic projection apparatus LPA, according to an embodiment.

Source collector module SO may be part of an LPA radiation system. A laser LA can be arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

Figure 19:
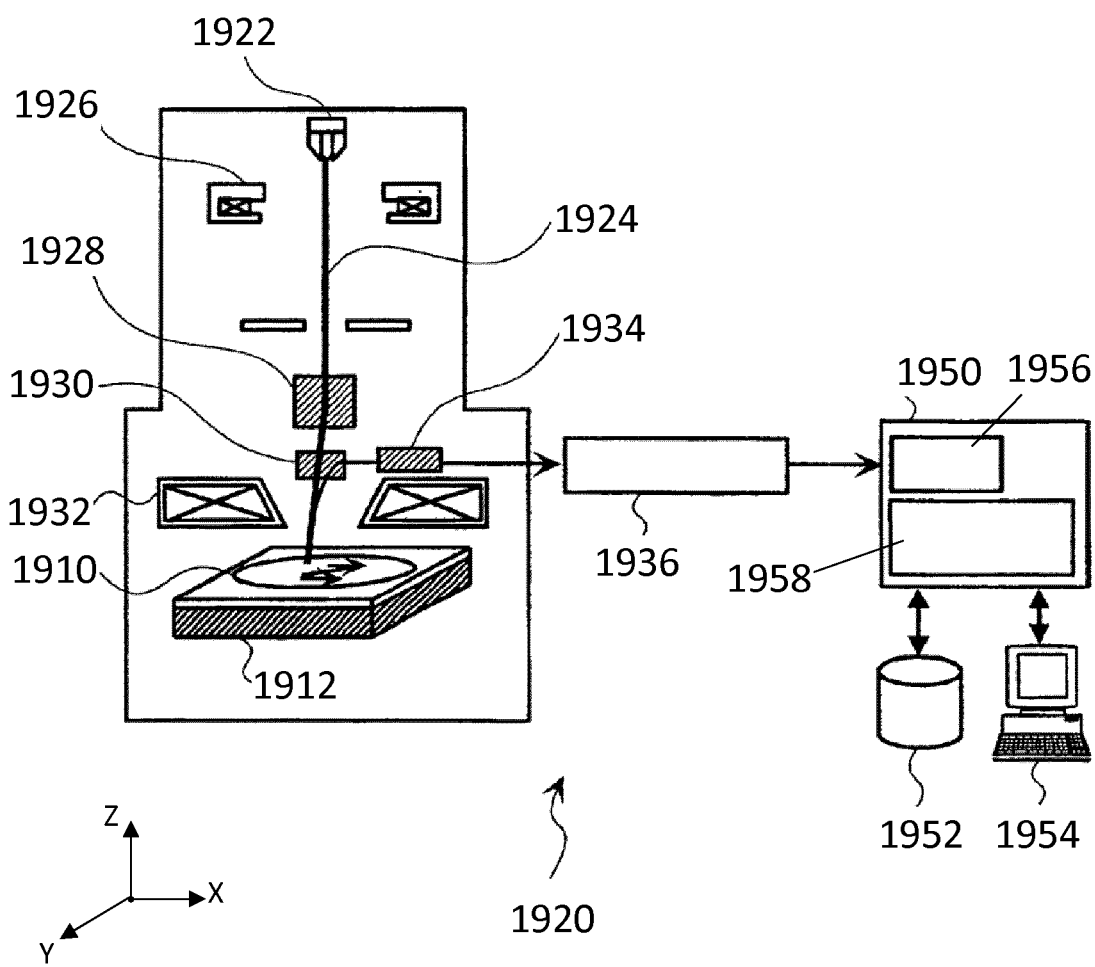
FIG. 19 schematically depicts an embodiment of an electron beam inspection apparatus, according to an embodiment.

FIG. 19 schematically depicts an embodiment of an electron beam inspection apparatus 1920, according to an embodiment. In an embodiment, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate. A primary electron beam 1924 emitted from an electron source 1922 is converged by condenser lens 1926 and then passes through a beam deflector 1928, an E×B deflector 1930, and an objective lens 1932 to irradiate a substrate 1910 on a substrate table 1912 at a focus.

When the substrate 1910 is irradiated with electron beam 1924, secondary electrons are generated from the substrate 1910. The secondary electrons are deflected by the E×B deflector 1930 and detected by a secondary electron detector 1934. A two-dimensional electron beam image can be obtained by detecting the electrons generated from the sample in synchronization with, e.g., two dimensional scanning of the electron beam by beam deflector 1928 or with repetitive scanning of electron beam 1924 by beam deflector 1928 in an X or Y direction, together with continuous movement of the substrate 1910 by the substrate table 1912 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 1928 can provide the electron beam 1924). Thus, the spatial extent of the field of the view is the spatial extent to which the angular range of the electron beam can impinge on a surface (wherein the surface can be stationary or can move with respect to the field).

A signal detected by secondary electron detector 1934 is converted to a digital signal by an analog/digital (A/D) converter 1936, and the digital signal is sent to an image processing system 1950. In an embodiment, the image processing system 1950 may have memory 1956 to store all or part of digital images for processing by a processing unit 1958. The processing unit 1958 (e.g., specially designed hardware or a combination of hardware and software or a computer readable medium comprising software) is configured to convert or process the digital images into datasets representative of the digital images. In an embodiment, the processing unit 1958 is configured or programmed to cause execution of a method described herein. Further, image processing system 1950 may have a storage medium 1956 configured to store the digital images and corresponding datasets in a reference database. A display device 1954 may be connected with the image processing system 1950, so that an operator can conduct necessary operation of the equipment with the help of a graphical user interface.

Figure 20:
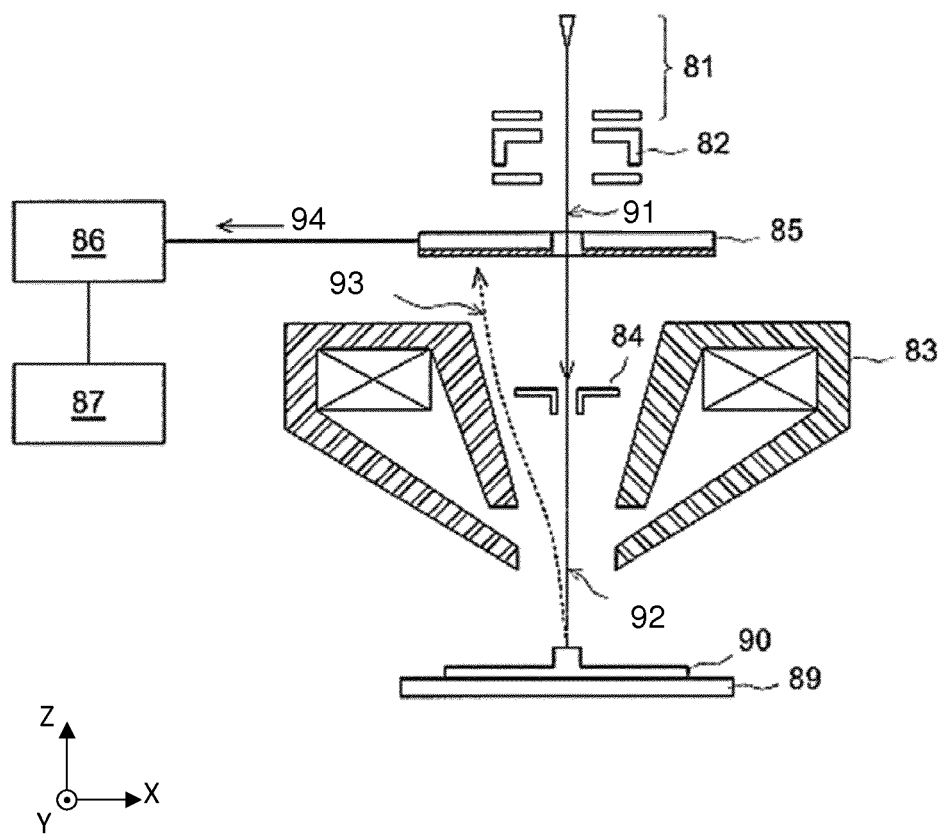
FIG. 20 schematically illustrates a further embodiment of an inspection apparatus, according to an embodiment.

FIG. 20 schematically illustrates a further embodiment of an inspection apparatus, according to an embodiment. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 19 that uses a probe to inspect a substrate, the electron current in the system of FIG. 20 is significantly larger compared to, e.g., a CD SEM such as depicted in FIG. 19, such that the probe spot is large enough so that the inspection speed can be fast. However, the resolution may not be as high as compared to a CD SEM because of the large probe spot.

The SEM images, from, e.g., the system of FIG. 19 and/or FIG. 20, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images. Alternatively, metrics can include EP gauges as described herein.

Now, besides measuring substrates in a patterning process, it is often desirable to use one or more tools to produce results that, for example, can be used to design, control, monitor, etc. the patterning process. To do this, there may be provided one or more tools used in computationally controlling, designing, etc. one or more aspects of the patterning process, such as the pattern design for a patterning device (including, for example, adding sub-resolution assist features or optical proximity corrections), the illumination for the patterning device, etc. Accordingly, in a system for computationally controlling, designing, Etc. a manufacturing process involving patterning, the major manufacturing system components and/or processes can be described by various functional modules. In particular, in an embodiment, one or more mathematical models can be provided that describe one or more steps and/or apparatuses of the patterning process, including typically the pattern transfer step. In an embodiment, a simulation of the patterning process can be performed using one or more mathematical models to simulate how the patterning process forms a patterned substrate using a measured or design pattern provided by a patterning device.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions herein are intended to be illustrative, not limiting. Thus, it will be apparent to one skilled in the art that modifications may be made as described without departing from the scope of the claims set out below.

Figure 21:
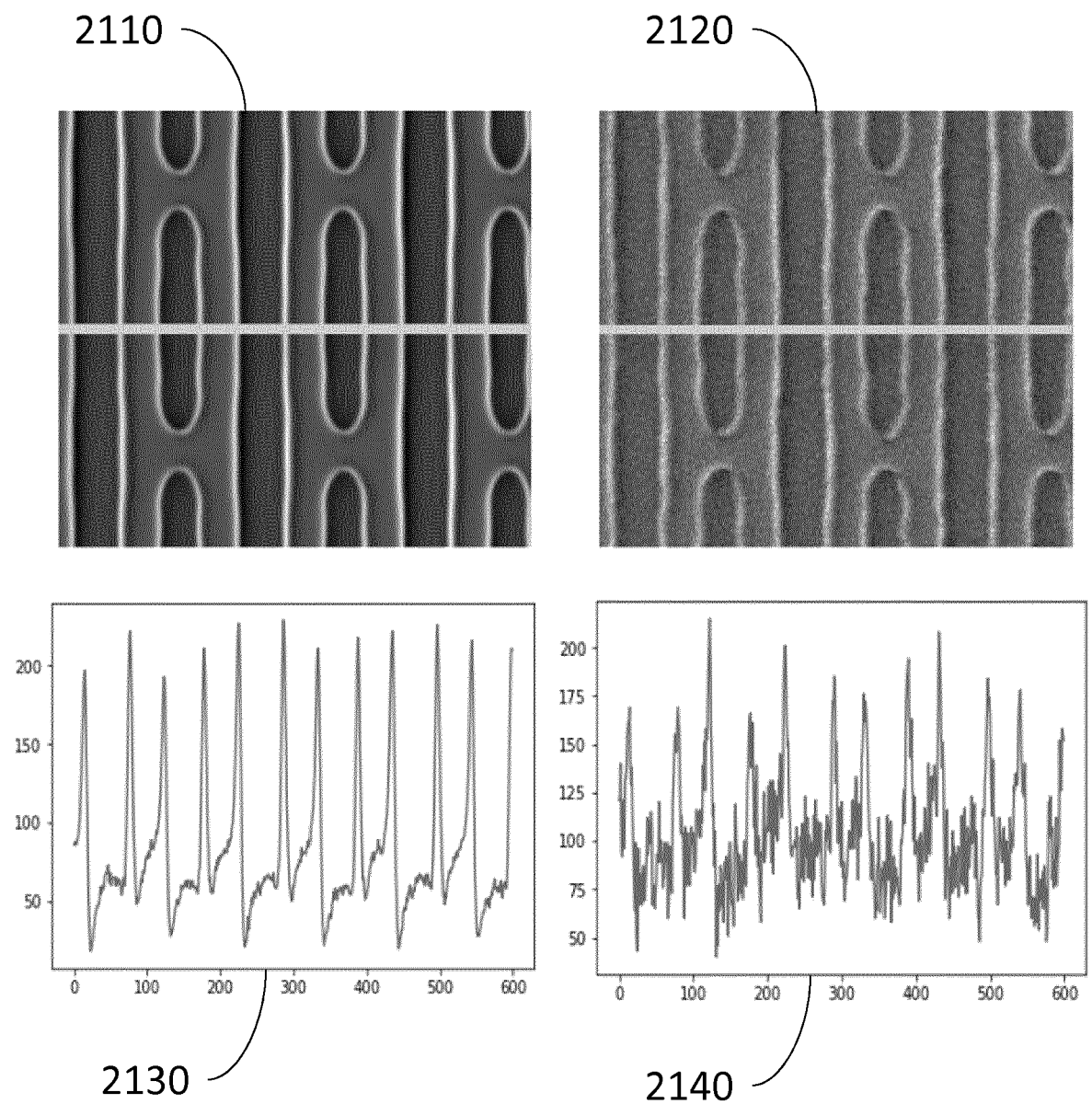
FIG. 21 is a diagram illustrating raw and averaged images of a printed pattern, according to an embodiment.

FIG. 21 is a diagram illustrating raw and averaged images of a printed pattern, according to an embodiment.

The present disclosure describes, among other things, acquiring and analyzing a large number of images of a printed pattern to perform high-quality metrology as part of a lithographic process. As illustrated in FIG. 21, an averaged image 2110 (shown on the upper left) can exhibit a more clearly defined structure than a raw image 2120 (shown on the upper right). An example of how such a difference can be quantified is illustrated by the two plots (2130, 2140) of a signal-to-noise ratio as shown below the images. In both plots, peaks in the signal-to-noise ratio can be seen as generally corresponding with the edges of the features appearing in the images (2110, 2120) above. However, comparing the two plots shows that the plot 2140 corresponding to the raw image 2120 contains increased noise, whereas the plot 2130 corresponding to the averaged image 2110 has a reduced noise level.

Figure 22:
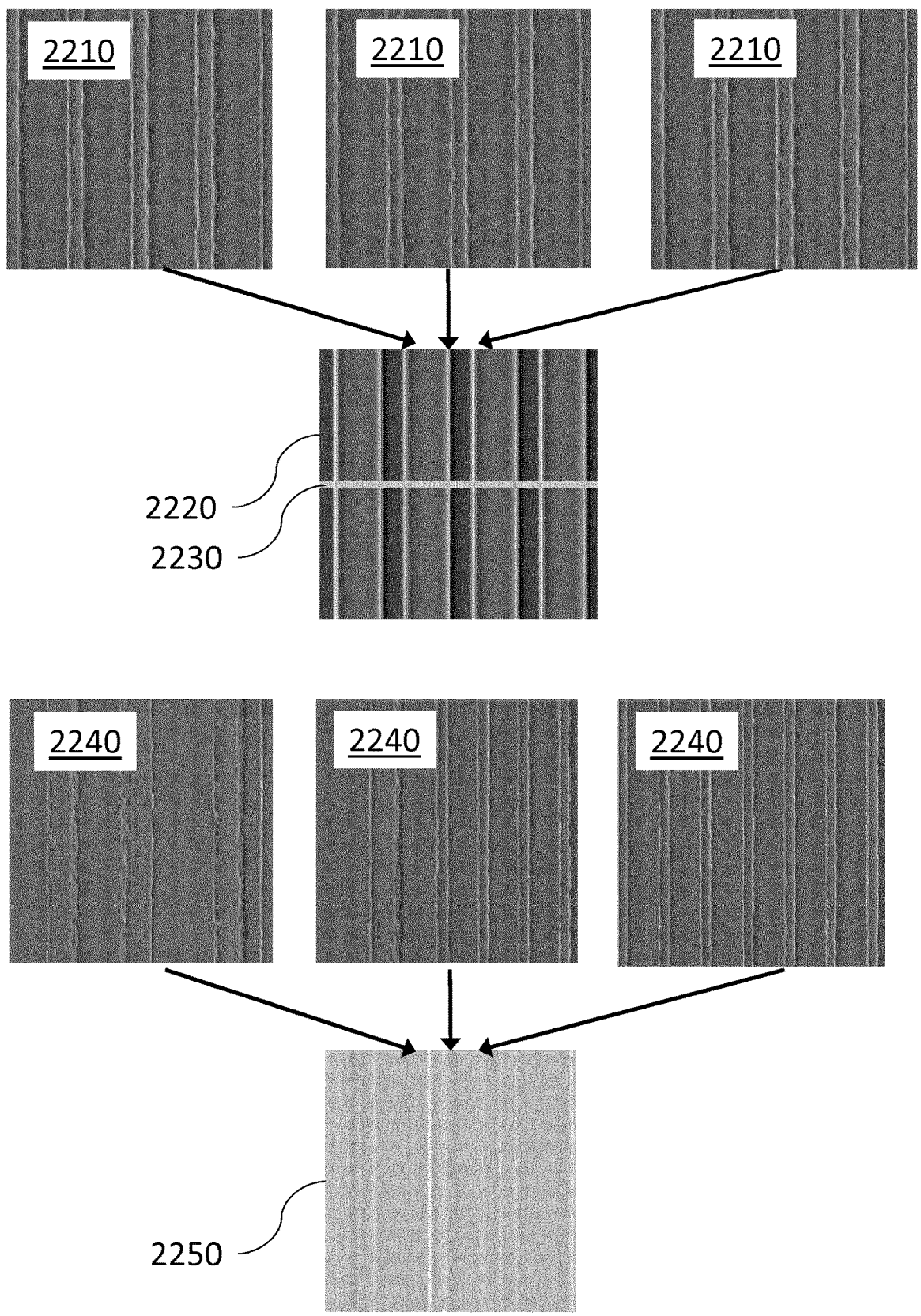
FIG. 22 is a diagram illustrating "good" and "bad" averaged images of a printed pattern, according to an embodiment.

FIG. 22 is a diagram illustrating "good" and "bad" averaged images of a printed pattern, according to an embodiment.

Characterizing the accuracy of the lithographic process can include analyzing averaged images. For example, on a printed pattern, some structural features may be repeated in different locations. The structural features can include, for example, channels, ridges, troughs, assist features, sub-resolution assist features, edge configurations, vertical slopes, etc. As illustrated previously in FIG. 21, raw images of the printed pattern can be averaged and thereby can have a generally improved image quality over an individual image. However, this may not be sufficient for generating an averaged image that is usable or desired for performing accurate metrology. For example, if raw images are misaligned, then the resultant averaged image may not be representative of the true structural configuration of the printed pattern. Conversely, if even after averaging, the averaged images still evaluated as being insufficient as a usable averaged image, this can indicate defects in the printed pattern, errors in the imaging process, etc.

Examples of a "good" and "bad" averaged images are illustrated in FIG. 22. As illustrated in FIG. 22, any number of raw images can be acquired with an image capture device, which can include at least one of a scanning electron microscope, an atomic force microscope, and an electron beam inspection system. Once raw images are acquired, an averaged image of the printed pattern can be generated by averaging the raw images of the printed pattern. In the example of FIG. 22, averaged image 2220 is seen to be cleaner and exhibit higher contrast than the individual raw images 2210 and thus can provide an improved image for performing metrology. For example, the horizontal line across the features shown in averaged image 2220 can represent cutline 2230. Accordingly, measurements of a critical dimension could be taken along cutline 2230.

In contrast, an example of a "bad" averaged image 2250 is shown in the lower half of FIG. 22. Here, the example averaged image 2250 was generated based on three raw images 2240, some of which contain printing defects. Accordingly, bad averaged image 2250 does not contain the clear and reliable features shown in good averaged image 2220 where the printing did not have defects.

There can be other sources of error that can result in "bad" averaged images, for example, misalignment during image acquisition or analysis. As part of generating the averaged image, a method can include aligning the raw images and generating the averaged image from the aligned raw images. Methods of alignment can include, for example, those described elsewhere herein, in particular with reference to FIGS. 4 and 5.

Figure 23:
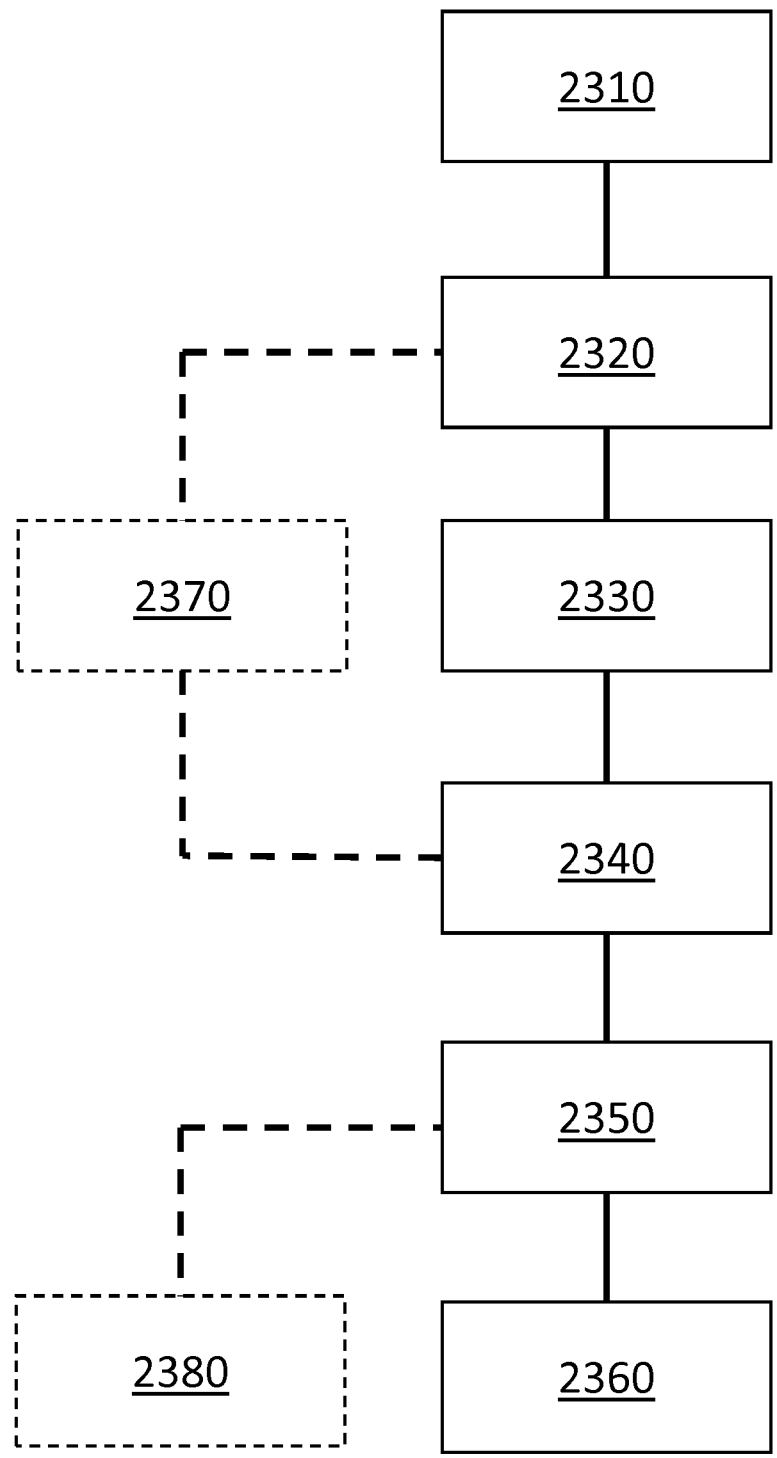
FIG. 23 is a process flow diagram illustrating an exemplary implementation of an image quality classification model, according to an embodiment.

FIG. 23 is a process flow diagram illustrating an exemplary implementation of an image quality classification model, according to an embodiment.

Computer-based models can be used to determine, in an objective and quantitative manner, whether an averaged image is of sufficient quality to be used for metrology or any other part of the lithography process. As a simplified explanation, the model can receive an averaged image as input, and can output, for example, "true" or "false" when determining whether or not the averaged image is good or bad. For example, a method for evaluating images of a printed pattern can be implemented by at least one programmable processor and can include obtaining an averaged image of the printed pattern, where the averaged image can be generated by averaging raw images of the printed pattern. The method can also include identifying one or more features of an averaged image and evaluating the averaged image by executing an image quality classification model (also referred to herein as "the model.") The model evaluation can be based at least on the features in the averaged image and can determine whether the averaged image satisfies a metric.

The features of the first averaged image evaluated by the image quality classification model can include at least one of an edge, an assist feature, and a sub-resolution assist feature. Also, the metric can be based on at least one or more of a signal-to-noise ratio, a contrast, a cost (e.g., as calculated by a cost function), and an alignment quality, where the metric corresponds to the raw images that were averaged to generate the averaged image. For example, based on a signal-to-noise ratio (as a metric) associated with an edge (a feature) the model can determine whether the averaged image is good (e.g., true or false).

The process flow diagram shown in FIG. 23 provides one example of an operation sequence that can evaluate averaged images, generate an improved averaged image, or modify the operation of another component of a lithography or metrology system (e.g., an SEM).

At 2310, raw images (as illustrated for example by 2120, 2210, 2240) can be acquired from a printed pattern.

At 2320, a selection of the raw images can be used to generate an averaged image. The selection can be from some or all of the raw images.

At 2330, features (e.g., edges, sizes, shapes, etc. of assist features, and so on) of the averaged image can be identified and input into the model for use in evaluating the averaged image.

At 2340, the model can be applied with the raw images (and associated features) as input, to evaluate whether the averaged image is good or bad.

At 2350, the method can also include generating a label for at least one of the raw images. The label can indicate whether the first averaged image satisfies the metric. Also, the method can include associating, in a computer memory, the label with at least one of the raw images. As used herein, a "label" can include any numerical or Boolean value, metadata, database entry, tagging, or the like, that can be applied either directly to a raw image to label it, or can be generally associated with a particular image (e.g., through the use of relational databases, pointers, etc.). For example, when an averaged image is generated and determined by the model to be good, then all of the raw images used to generate the averaged image can be labeled as "good." Returning to the example of FIG. 22, the three raw images that generated the good averaged image would then be labelled as "good." Conversely, the three raw images that generated the bad averaged image would then be labelled as "bad." In this way, a large number of raw images can be classified by the model and labelled as usable for generating reliable averaged images.

Accordingly, in some embodiments, the label can be based on the output of a machine learning algorithm (for example as described further below) and can also be at least one of a score or a Boolean value that indicates whether the averaged image satisfies the metric. An example of the score that can be generated by the model can be a numerical value where a positive value indicates that the averaged image is good, a negative value indicates that an averaged image is bad, and a zero indicates that the model is unable to determine whether the averaged image is good or bad.

At 2360, the labeling described above can further enable another embodiment that can include generating a second averaged image that satisfies the metric, thereby being a "good" image. Here, the generating can include averaging a second group of raw images of the printed pattern that were labelled as satisfying the metric. Because the second group of raw images were previously labeled as "good" the average of these raw images will also be good.

In some embodiments, the image quality classification model can include, or be part of, a machine learning algorithm. In this way, the determination of whether an averaged image is good or bad can be based on an output of the machine learning algorithm. Examples of machine learning algorithms that can be implemented can include, but are not limited to, a supervised learning algorithm such as a neural network algorithm, a nearest neighbor algorithm, a naive Bayes algorithm, a decision tree algorithm, a linear regression algorithm, and a support vector machine algorithm. In some embodiments, the model can be trained with a dataset that identifies at least one example of the averaged image that does not satisfy the metric.

In other embodiments, either alone or in combination, the machine learning algorithm can include an unsupervised learning algorithm such as a k-means clustering and an association rule algorithm.

In some embodiments, the method can include, for example at 2370, generating a residual image corresponding to one of the raw images by at least subtracting one of the first raw images from the averaged image. In this way, the determination can be further based on the averaged image and the residual image.

In other embodiments, at 2380, some methods disclosed herein can include providing active feedback during operation of the image capture device to improve at least one of a focus of the image capture device and a contrast of raw images acquired by the image capture device. For example, when the model analyzes raw images and determines that many or all of the raw images result in averaged images that are bad, this information can be used to modify the operation of, for example, an SEM such that the raw images acquired may be improved in some regard (e.g., automatically improving the operation of the image capture device). In this way, the disclosed subject matter provides methods that can be used to iteratively refine the acquisition of raw images to provide the best possible set of raw images for analysis by the model.

Figure 24:
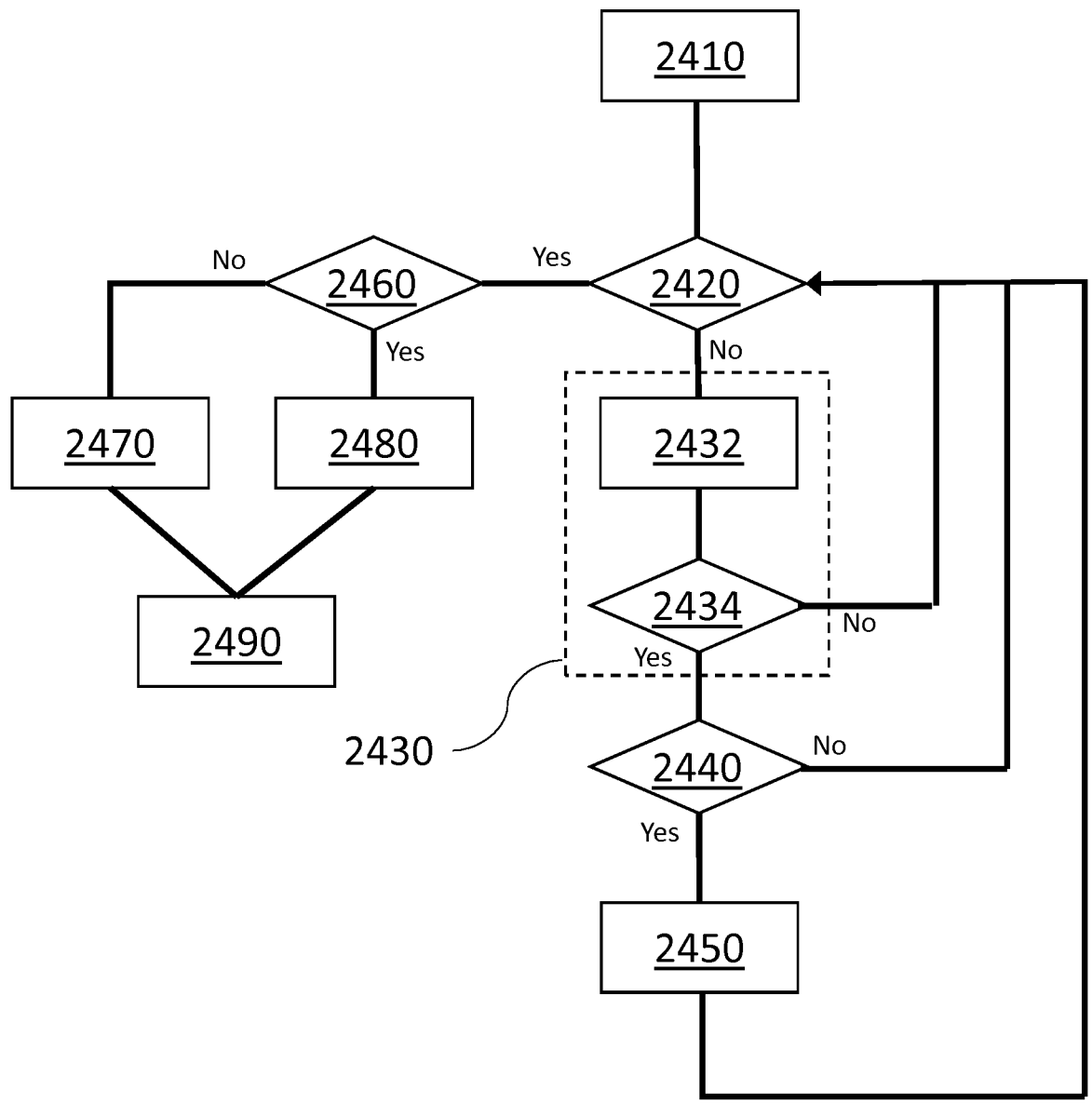
FIG. 24 is a process flow diagram illustrating an exemplary image quality classification model that iteratively improves averaged images, according to an embodiment.

FIG. 24 is a process flow diagram illustrating an exemplary image quality classification model that iteratively improves averaged images, according to an embodiment.

In some embodiments, instead of, or in addition to, evaluating averaged images and labeling raw images, some methods can provide a best possible averaged image based on the available raw images. One exemplary implementation of such is shown in FIG. 24, where, at 2410, raw images can be acquired and input into the computational process (e.g., similar to the acquisition of raw images described elsewhere herein).

At 2420, a check can be performed to determine whether a maximum number of iterations have been reached. The maximum number of iterations can be specified based on user generated input, or can be automatically determined by a computer program.

When the maximum number of iterations have not been reached, the model 2430 can then (at 2432) generate a configuration that includes one possible combination of raw images acquired from the printed pattern. For example, a configuration can include a listing of locations in the printed pattern where raw images acquired. In another embodiment, a configuration can include a subset of the available raw images (e.g., as a particular combination of raw images) that can be used to generate a candidate averaged image.

A contrast (e.g., a value or expression that quantifies the contrast in the candidate averaged image) can be calculated. In this way, candidate averaged images can be compared by each other with the model, or, in other embodiments, the model can use the contrast as an input that influences the output of the model.

Similarly, in other embodiments, an alignment quality can be calculated for the configuration. In such embodiments, the alignment quality can represent the degree to which the raw images that make up the candidate image are aligned (such as by any of the alignment procedures described herein). The alignment quality can include calculating coordinate differences, standard deviations, etc., between corresponding points or aspects of the raw images (e.g., corresponding EP gauges, CDs, etc.). In other embodiments, the alignment quality can include calculating a correlation coefficient between the raw images, indicating, for example, that a highly correlated set of raw images has a high alignment quality.

At 2434, the model 2430 can determine whether the averaged image is good or bad, for example based at least in part on one or more of the contrast or the alignment quality. When the averaged image is bad, the process can continue with another iteration (determining a new configuration and candidate averaged image) if the maximum number of iterations have not been reached.

At 2440, when the candidate averaged image has been evaluated as "good" by the model 2430, then the process can determine whether the candidate averaged image is better than a current averaged image (which is understood to be the current best possible averaged image). In some embodiments, when the output of the model is a score, then the score (e.g., a higher positive score as described above) can be used to determine that the candidate averaged image is better. In other embodiments, the determination can be based on calculating a signal-to-noise ratio of the candidate image (which may be from the entire candidate image, or from specific portions of the candidate image) and comparing that to the current averaged image. When the candidate averaged image is not better than the current averaged image, the candidate averaged image will not be used and another iteration can occur.

At 2450, when the candidate averaged image is better than the current averaged image then the current averaged image can be replaced by the candidate averaged image.

At 2460, once the maximum number of iterations have been reached, a check can be performed to determine whether there is presently an established best averaged image.

At 2470, when there is no established best averaged image then a listing can be stored in computer memory that identifies the raw images in the current configuration and associates the configuration with an averaged image (which may also be stored). The listing can be, for example, an array, a set of pointers, a database entry, a data file, etc.

At 2480, when there is an already established best averaged image, but the updated best average image (e.g., as determined at 2420-2450) is better than the best averaged image, then the updated best averaged image is saved to computer memory and the corresponding listing can also be saved.

At 2490, the raw images associated with the updated best averaged image can be labelled as described herein.

The embodiments may further be described using the following clauses:

1. A method for improving a process model for a patterning process, the method comprising:
    obtaining a) a measured contour from an image capture device, and b) a simulated contour generated from a simulation of the process model;
    aligning the measured contour with the simulated contour by determining an offset between the measured contour and the simulated contour; and
    calibrating the process model to reduce a difference, computed based on the determined offset, between the simulated contour and the measured contour.
2. The method of clause 1, wherein the offset is further determined based on measurement coordinates substantially defining a portion of the measured contour.
3. The method of clause 2, wherein the offset is further determined based on distances between the measurement coordinates and the simulated contour, the distances being in directions perpendicular to the measured contour at the measurement coordinates.
4. The method of clause 3, the aligning further comprising reducing a cost function calculated based on the distances.
5. The method as in any preceding clause, further comprising generating an edge placement (EP) coordinate on the measured contour, and wherein the offset is further determined based on the EP coordinate.
6. The method of clause 5, wherein the EP coordinate is generated by interpolating between two or more measurement coordinates.
7. The method of clause 6, wherein the EP coordinate is generated by extrapolating from two or more measurement coordinates.
8. The method as in any preceding clause, the calibrating further comprising modifying a feature of the process model to reduce the difference, the modifying causing a change to a shape of the simulated contour.
9. The method as in any preceding clause, wherein the measured contour is identified based on a change in intensity of pixels in the measured image.
10. The method of clause 9, wherein the identifying is based on the change exceeding a greyscale threshold.
11. The method as in any preceding clause, further comprising:
    obtaining the simulated contour from Graphic Database Systems (GDS) polygons; and
    converting edge placement coordinates or measurement coordinates comprising the measured contour into GDS coordinates.
12. The method of clause 11, wherein the GDS polygons can be in one or more formats selected from GDS stream format (GDSII) and Open Artwork System Interchange Standard (OASIS).
13. A method for improving an optical proximity correction (OPC) model for a patterning process, the method comprising:
    obtaining a) a measured contour from an image capture device, and b) a simulated contour generated from a simulation of the OPC model;
    aligning the measured contour with the simulated contour by determining an offset between the measured contour and the simulated contour; and
    modifying features of the OPC model to reduce a difference, computed based on the determined offset, between the simulated contour and the measured contour.
14. The method of clause 13, wherein the features include one or more of a diffusion rate, a diffusion range, a deprotection ratio, and an acid/base concentration.
15. The method of any of clauses 13-14, further comprising:
    obtaining the simulated contour based on the simulation of the OPC model, wherein the OPC model is a preliminary model that includes an optical model and does not include a resist model.
16. The method of any of clauses 13-15, further comprising:
    obtaining an initial simulated contour with a preliminary model that includes an optical model and a resist model;
    modifying features of the resist model to reduce the difference between the initial simulated contour and the measured contour.
17. A method for improving a process model for a patterning process, the method comprising:
    obtaining a) a plurality of measured images from an image capture device, and b) a simulated contour generated from a simulation of the process model;
    aligning the plurality of measured images;
    generating a combined measured image from the aligned plurality of measured images;
    extracting a measured contour from the combined measured image by an image analysis method;
    aligning the measured contour with the simulated contour by determining an offset between the measured contour and the simulated contour; and
    calibrating the process model to reduce a difference, computed based on the determined offset, between the simulated contour and the measured contour.
18. The method of clause 17, wherein the combined image is generated by averaging the aligned plurality of measured images.
19. The method of any of clauses 17-18, wherein the plurality of measured images are obtained from printed patterns from at least two different dies manufactured from a target pattern.
20. The method of any of clauses 17-19, wherein each of the plurality of measured images generating the combined image is acquired by scanning a different die.
21. The method of any of clauses 17-20, wherein the image capture device is a scanning electron microscope.
22. The method of clause 21, wherein the obtaining of the plurality of measured images is performed by scanning an electron beam over a printed pattern at a plurality of angles.
23. The method of clause 22, wherein the plurality of angles include approximately +45 degrees and −45 degrees.

24. The method of clause 22 or 23, wherein half of the plurality of measured images are scanned at approximately +45 degrees and another half of the plurality of measured images are scanned at approximately −45 degrees.
25. The method of any of clauses 21 to 24, wherein the obtaining is performed with the scanning electron microscope operating at a dosage below that required to obtain a scan sufficient to resolve a critical dimension.
26. The method of any of clauses 17-25, wherein the image capture device is an electron beam inspection system.
27. The method of clause 26, wherein the electron beam inspection system has a large field of view and the plurality of measured images are obtained at least partially from within the large field of view.
28. The method of clause 27, wherein the large field of view is approximately 1-50 microns on a side.
29. The method of clause 27 or 28, wherein the large field of view is approximately 6-12 microns on a side.
30. The method of any of clauses 26 to 29, further comprising detecting, with the electron beam inspection system, hotspots or weak-points in a printed pattern.
31. The method of any of clauses 17-30, the method further comprising:
    determining a common area in the plurality of measured images captured from the image capture device; and
    generating the combined measured image based on the common area.
32. A method for evaluating images of a printed pattern, the method implemented by at least one programmable processor and comprising:
    obtaining a first averaged image of the printed pattern, the first averaged image generated by averaging a first plurality of raw images of the printed pattern;
    identifying one or more features of the first averaged image; and
    evaluating the first averaged image, by the at least one programmable processor executing an image quality classification model and based at least on the one or more features, the evaluating comprising:
       determining, by the image quality classification model, whether the first
       averaged image satisfies a metric.
33. The method of clause 32, wherein the first averaged image is generated by at least aligning the plurality of raw images and generating the first averaged image from the aligned plurality of raw images.
34. The method of clause 32, further comprising:
    generating a label for at least one of the plurality of raw images that indicates whether the first averaged image satisfies the metric; and
    associating, in a computer memory, the label with the at least one of the plurality of raw images.
35. The method of clause 34, further comprising:
    generating a second averaged image, the generating comprising:
       averaging a second plurality of raw images of the printed pattern that were labelled as satisfying the metric, wherein the second averaged image satisfies the metric.
36. The method of clause 32, further comprising training the image quality classification model with a dataset that identifies at least one example of the first averaged image that does not satisfy the metric.
37. The method of clause 32, further comprising:
    generating a residual image corresponding to one of the first plurality of raw images by at least subtracting one of the first plurality of raw images from the first averaged image, and
    wherein the determining is further based on the first averaged image and the residual image.
38. The method of clause 32, wherein the one or more features of the first averaged image evaluated by the image quality classification model include at least one of an edge, an assist feature, and a sub-resolution assist feature.
39. The method of clause 32, wherein the metric is based on at least one or more of a signal-to-noise ratio, a contrast, and an alignment quality, and the metric corresponds to the first plurality of raw images that were averaged to generate the averaged image.
40. The method of clause 34, the image quality classification model further comprising a machine learning algorithm, wherein the determining is based on an output of the machine learning algorithm.
41. The method of clause 34, wherein the label is based on the output of the machine learning algorithm and is at least one of a score or a Boolean value that indicates whether the first averaged image satisfies the metric.
42. The method of clause 34, wherein the machine learning algorithm comprises at least one of a neural network algorithm, a nearest neighbor algorithm, a naive Bayes algorithm, a decision tree algorithm, a linear regression algorithm, and a support vector machine algorithm.
43. The method of clause 34, wherein the machine learning algorithm comprises at least one of a k-means clustering and an association rule algorithm.
44. The method of clause 32, wherein the first plurality of raw images or the second plurality of raw images are acquired with an image capture device comprising at least one of a scanning electron microscope, an atomic force microscope, and an electron beam inspection system.
45. The method of clause 44, further comprising:
    providing active feedback during operation of the image capture device to improve at least one of a focus of the image capture device and a contrast of raw images acquired by the image capture device.
46. A computer program product comprising a non-transitory computer readable medium having instructions recorded thereon, the instructions when executed by a computer implementing the method of any of the above clauses.

The invention claimed is:
1. A method comprising:
    obtaining a first averaged image of a printed pattern, the first averaged image generated by averaging a first plurality of raw images of the printed pattern;
    identifying one or more features of the first averaged image; and
    evaluating the first averaged image, by at least one programmable processor executing an image quality classification model and based at least on the one or more features, the evaluating comprising determining, by the image quality classification model, whether the first averaged image satisfies a metric,
    wherein the image quality classification model comprises a machine learning algorithm, and
    wherein the determining is based on the machine learning algorithm.
2. The method of claim 1, wherein the first averaged image is generated by at least aligning the plurality of raw images and generating the first averaged image from the aligned plurality of raw images.

3. The method of claim 1, further comprising:
generating a label for at least one of the plurality of raw images that indicates whether the first averaged image satisfies the metric; and
associating, in a computer memory, the label with the at least one of the plurality of raw images.

4. The method of claim 3, further comprising generating a second averaged image, the generating comprising averaging a second plurality of raw images of the printed pattern that were labelled as satisfying the metric, wherein the second averaged image satisfies the metric.

5. The method of claim 1, further comprising training the image quality classification model with a dataset that identifies at least one example of the first averaged image that does not satisfy the metric.

6. The method of claim 1, further comprising generating a residual image corresponding to one of the first plurality of raw images by at least subtracting one of the first plurality of raw images from the first averaged image, and
wherein the determining is further based on the first averaged image and the residual image.

7. The method of claim 1, wherein the one or more features of the first averaged image evaluated by the image quality classification model include at least one selected from: an edge, an assist feature, and/or a sub-resolution assist feature.

8. The method of claim 1, wherein the metric is based on at least one selected from: a signal-to-noise ratio, a contrast, and/or an alignment quality, and the metric corresponds to the first plurality of raw images that were averaged to generate the averaged image.

9. The method of claim 3, wherein the label is based on the output of the machine learning algorithm and is a score and/or a Boolean value, that indicates whether the first averaged image satisfies the metric.

10. The method of claim 1, wherein the machine learning algorithm comprises at least one selected from: a neural network algorithm, a nearest neighbor algorithm, a naive Bayes algorithm, a decision tree algorithm, a linear regression algorithm, and/or a support vector machine algorithm.

11. The method of claim 1, wherein the machine learning algorithm comprises a k-means clustering and/or an association rule algorithm.

12. The method of claim 1, wherein the first plurality of raw images are acquired with an image capture device comprising at least one selected from: a scanning electron microscope, an atomic force microscope, and/or an electron beam inspection system.

13. The method of claim 12, further comprising providing active feedback during operation of the image capture device to improve a focus of the image capture device and/or a contrast of raw images acquired by the image capture device.

14. A computer program product comprising a non-transitory computer readable medium having instructions therein, the instructions, when executed by a computer system, configured to cause the computer system to at least:
obtain a first averaged image of a printed pattern, the first averaged image generated by averaging a first plurality of raw images of the printed pattern;
identify one or more features of the first averaged image; and
evaluate the first averaged image, using an image quality classification model and based at least on the one or more features, the evaluation comprising determination, by the image quality classification model, of whether the first averaged image satisfies a metric,
wherein the image quality classification model comprises a machine learning algorithm, and
wherein the determination of whether the first averaged image satisfies a metric is based on the machine learning algorithm.

15. The computer program product of claim 14, wherein the first averaged image is generated by at least aligning the plurality of raw images and the first averaged image is generated from the aligned plurality of raw images.

16. The computer program product of claim 14, wherein the instructions are further configured to cause the computer system to:
generate a label for at least one of the plurality of raw images that indicates whether the first averaged image satisfies the metric; and
associate the label with the at least one of the plurality of raw images.

17. The computer program product of claim 14, wherein the instructions are further configured to cause the computer system to train the image quality classification model with a dataset that identifies at least one example of the first averaged image that does not satisfy the metric.

18. The computer program product of claim 14, wherein the instructions are further configured to cause the computer system to generate a residual image corresponding to one of the first plurality of raw images by at least subtracting one of the first plurality of raw images from the first averaged image, and the determination is further based on the first averaged image and the residual image.

19. The computer program product of claim 14, wherein the metric is based on at least one selected from: a signal-to-noise ratio, a contrast, and/or an alignment quality, and the metric corresponds to the first plurality of raw images that were averaged to generate the averaged image.

20. The computer program product of claim 14, wherein the one or more features of the first averaged image evaluated by the image quality classification model include at least one selected from: an edge, an assist feature, and/or a sub-resolution assist feature.

* * * * *